United States Patent [19]

Moslehi

[11] Patent Number: 5,293,216
[45] Date of Patent: Mar. 8, 1994

[54] SENSOR FOR SEMICONDUCTOR DEVICE MANUFACTURING PROCESS CONTROL

[75] Inventor: Mehrdad M. Moslehi, Dallas, Tex.

[73] Assignee: Texas Instruments Incorporated, Dallas, Tex.

[21] Appl. No.: 638,472

[22] Filed: Dec. 31, 1990

[51] Int. Cl.$^5$ .................. G01B 11/30; G01N 21/00; B23K 26/00
[52] U.S. Cl. .................................. 356/371; 356/73; 219/121.6
[58] Field of Search .................. 356/73, 443–448, 356/237, 371; 219/121.6; 250/227.29

[56] References Cited

U.S. PATENT DOCUMENTS

| 4,364,663 | 12/1982 | Gardner et al. | 356/371 |
| 4,874,240 | 10/1989 | Watts et al. | 356/446 |
| 4,956,538 | 9/1990 | Moslehi | 219/121.6 |
| 4,991,971 | 2/1991 | Geary et al. | 280/227.29 X |

FOREIGN PATENT DOCUMENTS 0161503 10/1982 Japan ................... 356/371

OTHER PUBLICATIONS

Hildebrand et al., "Instrument for Measuring the Roughness of Supersmooth Surfaces", Applied Optics, vol. 13, #1, Jan. 1974.

Clarke et al. "Roughness Measurement with a Laser Scanning Analyser", Wear, vol. 57, #1, Nov. 1979.

Primary Examiner—Vincent P. McGraw
Assistant Examiner—K. P. Hantis
Attorney, Agent, or Firm—Mark A. Valetti; Richard L. Donaldson

[57] ABSTRACT

A fiber-optic sensor device (210) for semiconductor device manufacturing process control measures polycrystalline film thickness as well as surface roughness and spectral emissivity of semiconductor wafer (124). The device (210) comprises a sensor arm (212) and an opto-electronic interface and measurement box (214), for directing coherent laser energy in the direction of semiconductor wafer (124). Opto-electronic interface/-measurement unit (214) includes circuitry for measuring the amounts of laser power coherently reflected in the specular direction from the semiconductor wafer (124) surface, scatter reflected from the semiconductor wafer (124) surface, coherently transmitted in the specular direction through the semiconductor wafer (124), and scatter transmitted through the semiconductor wafer (124). The present invention determines the semiconductor wafer (124) surface roughness and spectral emissivity values using the measured optical powers of incident, specular reflected, scatter reflected, specular transmitted, and scatter transmitted beams.

48 Claims, 14 Drawing Sheets

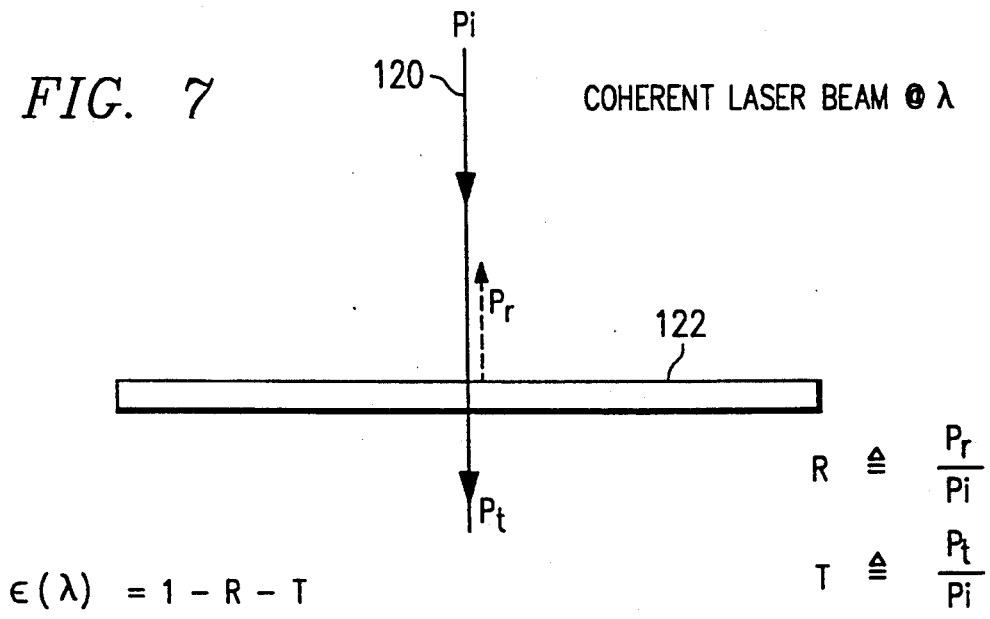
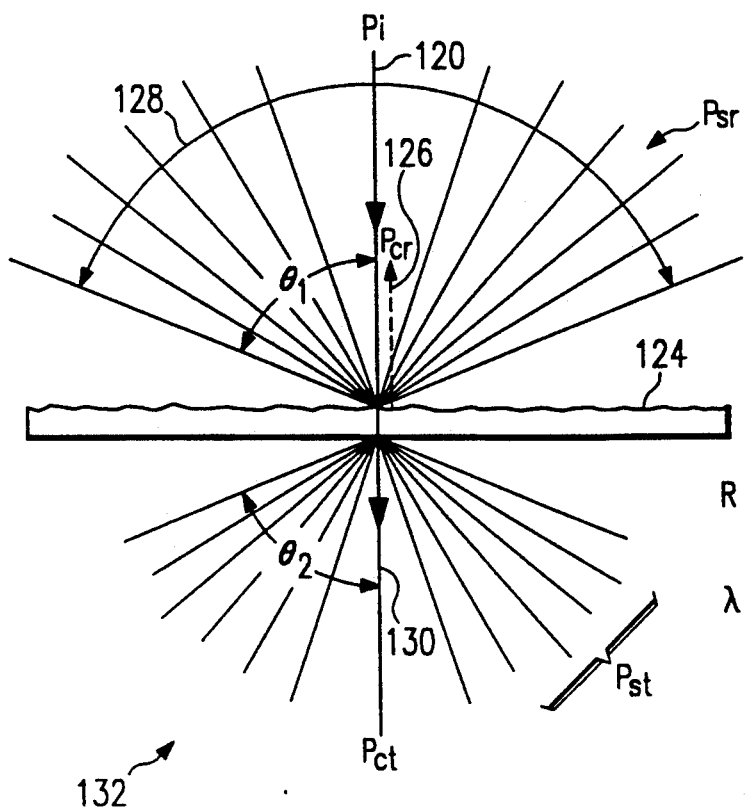

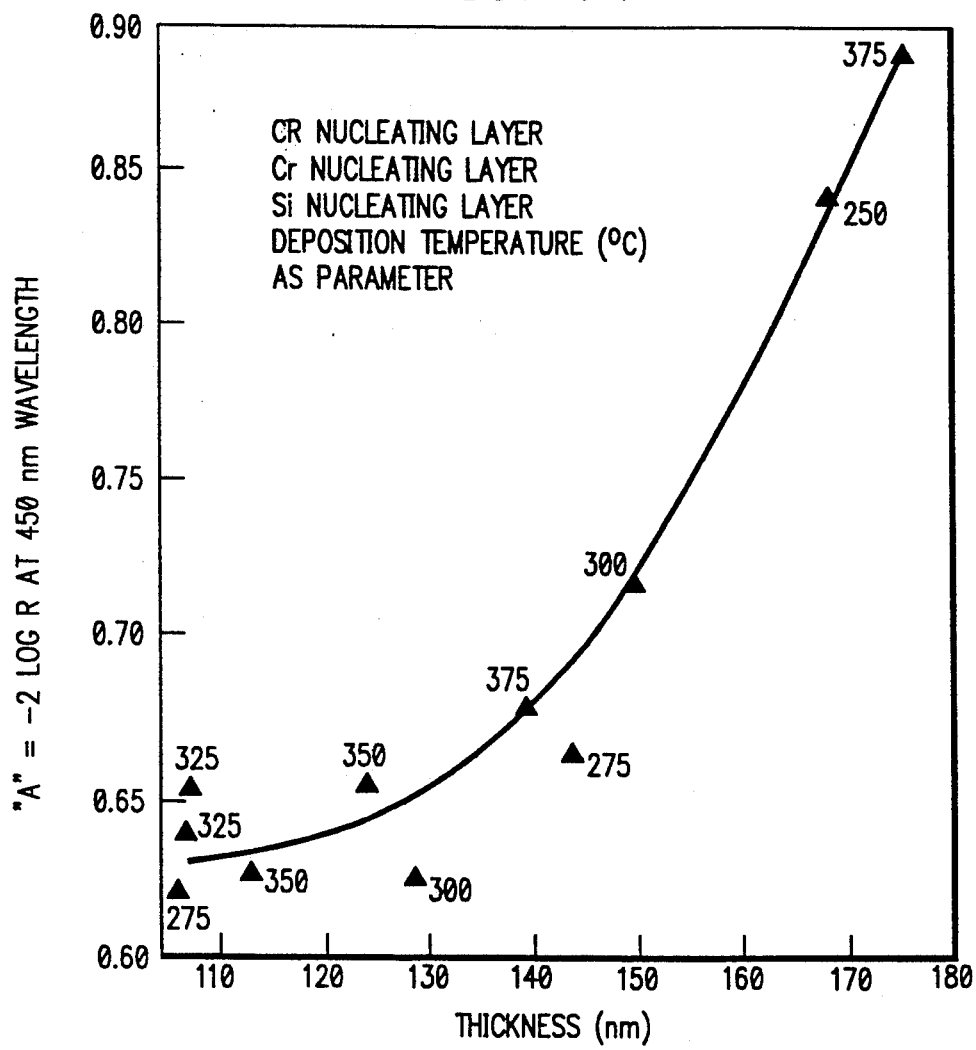
FIG. 14
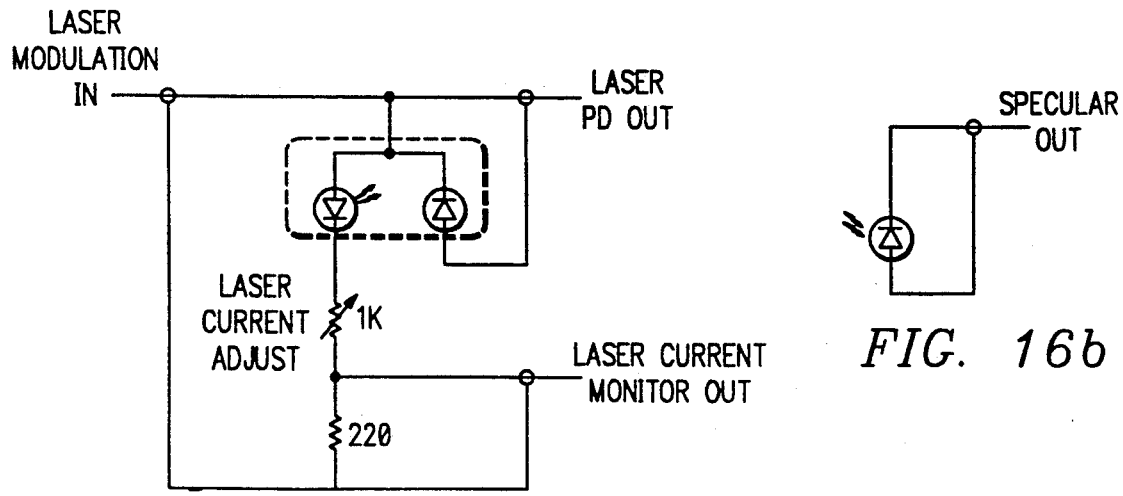
FIG. 16a
FIG. 16b

SENSOR FOR SEMICONDUCTOR DEVICE MANUFACTURING PROCESS CONTROL

Notice: The U.S. government has a paid up license in this invention and the right in limited circumstances to require the patent owner to license others on reasonable terms as provided for by the terms of a contract between assignee and the United States Air Force under the program name NMST.

TECHNICAL FIELD OF THE INVENTION

The present invention generally relates to measurement of semiconductor wafer physical characteristics, and more particularly to a method and apparatus for non-invasive in-situ measurements of polycrystalline layer thickness, surface roughness, and electromagnetic emissivity on semiconductor wafers.

BACKGROUND OF THE INVENTION

Integrated circuit chip manufacturers fabricate semiconductor devices by sequentially applying and patterning layers of usually not more than 1 μm thick to a semiconductor wafer. The device layers may comprise various materials such as insulating layers in addition to one or more of the following conductive layers: a thin metal film such as tungsten, aluminum, copper, or titanium; a thin polycrystalline silicon (polysilicon) coating doped with impurities; or other layers of metal silicides and metal nitrides. Process control and manufacturing tolerances apply to the various device fabrication processes. Deviations from specified target tolerances in excess of only a few percentage points may result in defective and rejected semiconductor chips.

Semiconductor device manufacturers can only discard rejected semiconductor chips, thus resulting in undesirable production process waste and increased device manufacturing costs. If it is possible, however, to closely monitor various process parameters in-situ during the process or immediately after processing each individual wafer, process parameters can be properly adjusted in order to achieve good process control and improved process parameter reproducibility. Thus, the need exists for accurate methods and sensors to measure physical parameters in-situ during or immediately after processing each semiconductor wafer.

Methods for applying polycrystalline layers on semiconductor wafers include processes known as chemical-vapor deposition (CVD), evaporation, and physical-vapor deposition (PVD) or sputtering. These thin film deposition processes usually take place in a low-pressure deposition chamber filled with process gases using thermal, photo or plasma activation to generate the necessary species for deposition of layers such as refractory metals or aluminum. To maintain layer uniformity across an individual semiconductor wafer surface, as well as process repeatability from wafer to wafer during the processing of many wafers, it is important to know the thickness of the polycrystalline layer deposited on the wafer. However, known methods of measuring layer thicknesses on semiconductor wafers mostly require physical contact with the layer. But, physical contact with a wafer in the processing reactor can be detrimental to the process or wafer and may reduce the device manufacturing yield. Therefore, there is a need for a non-invasive method and apparatus for measuring the thicknesses of layers and other physical characteristics of semiconductor wafers.

Physical properties of semiconductor wafer layers and the semiconductor substrates themselves that a sensor should measure include the following:

(1) thickness measurements of CVD metal films;

(2) thickness measurements of other polycrystalline films;

(3) roughness and reflectance measurements of the semiconductor wafer or conductive layer surface;

(4) spectral emissivity measurements of the semiconductor wafer; and (5) background doping concentration measurements of the wafer.

There are no known methods or systems for in-situ non-invasive measurements of the above properties for monitoring physical parameters of the semiconductor wafers during, before, or after a device fabrication process. In particular, there is not presently a low-cost non-invasive sensor that can provide in-situ pre-process or post-process thickness measurements for CVD metal films or other polycrystalline films such as polycrystalline silicon. Moreover, although some measurement systems can provide off-line surface roughness and reflectance measurements of semiconductor wafer surfaces, no known sensor system can provide such comprehensive measurements in-situ either immediately prior to or following a CVD or other deposition or etching process. Additionally, there is no low-cost compact reliable sensor that can fit within a semiconductor wafer processing reactor to provide non-invasive in-situ measurements of layer thickness, surface roughness and reflectance, spectral emissivity, and background doping of semiconductor wafers.

Thus, there is a need for a non-invasive system that can provide thickness measurements of metal films and other polycrystalline films on semiconductor wafers.

There is a need for a non-invasive in-situ sensor for performing thickness measurements of metal films and other polycrystalline films on a semiconductor wafer immediately before and after a deposition, etching, or other fabrication process (e.g., high-temperature CVD).

There is yet a need for a sensor that can provide surface roughness measurements of semiconductor wafers.

There is still a need for a sensor that can provide spectral emissivity measurements of semiconductor wafers.

Moreover, there is a need for an inexpensive and compact sensor system that can provide all of the above measurements as well as uniformity data. Furthermore, a need exists for a low-cost compact sensor that can measure metal or polycrystalline film thickness, surface roughness and reflectance, and spectral emissivity that is non-invasive and can be mounted in a semiconductor wafer processing reactor or wafer metrology chamber.

SUMMARY OF THE INVENTION

The present invention accordingly provides an apparatus and method for non-invasive in-situ measurements of physical properties of metal and polycrystalline layers as well as semiconductor wafer surface roughness that substantially eliminate and reduce disadvantages and limitations associated with prior semiconductor wafer measurement methods, apparatuses, and systems.

One aspect of the invention is an electromagnetic or optical energy sensing device for semiconductor device manufacturing process control. The invention comprises a coherent optical or electromagnetic energy source that, through associated circuitry, directs coherent electromagnetic or optical energy in the direction of a semiconductor wafer. The coherent electromagnetic or optical energy probe beam interacts with the semiconductor wafer. A portion of the energy is coherently reflected by the wafer in the specular direction. Depending on the amount of roughness of the semiconductor wafer surface and the incident beam wavelength, a fraction of the reflected electromagnetic or optical energy may be scattered in the non-specular directions. The sensor of the present invention includes components for measuring the amounts of specular (coherent) and scattered (incoherent) electromagnetic or optical beam powers reflected from the semiconductor wafer surface. Components within the present invention then extract semiconductor wafer surface roughness and reflectance based on measurements of the incident beam power, the coherently reflected beam power (specular reflection) and the scatter reflected beam power.

It has been shown that chemical-vapor-deposited metal film and other polycrystalline layer thickness to at least a first order of accuracy, are directly related (mostly linearly) to the CVD polycrystalline film surface roughness. Consequently, by providing a direct measurement of CVD polycrystalline film surface roughness, the method and apparatus of the present invention can perform CVD polycrystalline film thickness measurement.

According to another aspect of the present invention, there is provided a sensor system that includes a coherent electromagnetic or optical energy source that is configured to direct an incident energy beam perpendicular to and in the direction of semiconductor wafer surface. Components of the present invention measure those specular portions of the optical or electromagnetic energy that are coherently reflected by and coherently transmitted through the semiconductor wafer. The present invention also includes components for measuring the non-specular portions of electromagnetic or optical energy that are scattered in both reflectance from and transmittance through the semiconductor wafer.

Based on the measured amounts of electromagnetic energy that are reflected by the semiconductor wafer in the specular and scattered directions, the present invention derives the specular, scattered, and total surface reflectance values. The measured amounts of electromagnetic or optical energy transmitted in the specular and scattered directions are used to determine the specular, scattered, and total transmittance values. By generating measured values for total reflectance and total transmittance, the present invention can determine the spectral emissivity of a semiconductor wafer. Moreover, by producing values for specular and scattered reflectance values, the present invention can extract the root-mean-square (RMS) surface roughness of the semiconductor wafer surface (e.g., for the unpolished backside) as well as the RMS roughness of any deposited layer on a wafer.

In the preferred embodiment of the present invention, the coherent electromagnetic energy source is a 1.3 $\mu$m (wavelength) semiconductor diode laser and the associated components include single-mode and multi-mode optical fibers. In-situ measurements can be performed within the vacuum-integrated load-lock chamber or a dedicated sensor chamber of various semiconductor wafer processing equipment including the vacuum-integrated cluster tools.

A technical advantage of the present invention is that it provides capabilities for semiconductor device manufacturing process control. Because the method and sensor apparatus are non-invasive and in situ, a process control computer can make continual adjustments and process parameter optimizations during the fabrication of a large quantity of semiconductor devices based on in-situ pre- and post-process wafer measurements in batch and single-wafer processing reactors.

BRIEF DESCRIPTION OF THE DRAWINGS

The invention and its modes of use and advantages are best understood by reference to the following description of illustrative embodiments when read in conjunction with the accompanying drawings, wherein:

FIG. 7 is a schematic diagram illustrating the relationship among specular emissivity, reflectance, and transmittance values for a highly polished semiconductor wafer;

FIG. 8 is a schematic diagram illustrating the specular and scattered components of the reflected and transmitted beams on unpolished semiconductor wafer with a rough surface;

FIG. 14 is a plot illustrating the effect of the CVD tungsten deposition temperature and thickness on surface roughness and/or specular reflectance;

FIGS. 16a and 16b are circuit diagrams from a semiconductor diode laser interface and specular photodetector incorporating a preferred embodiment of the present invention;

DETAILED DESCRIPTION OF THE INVENTION

Figure 18:
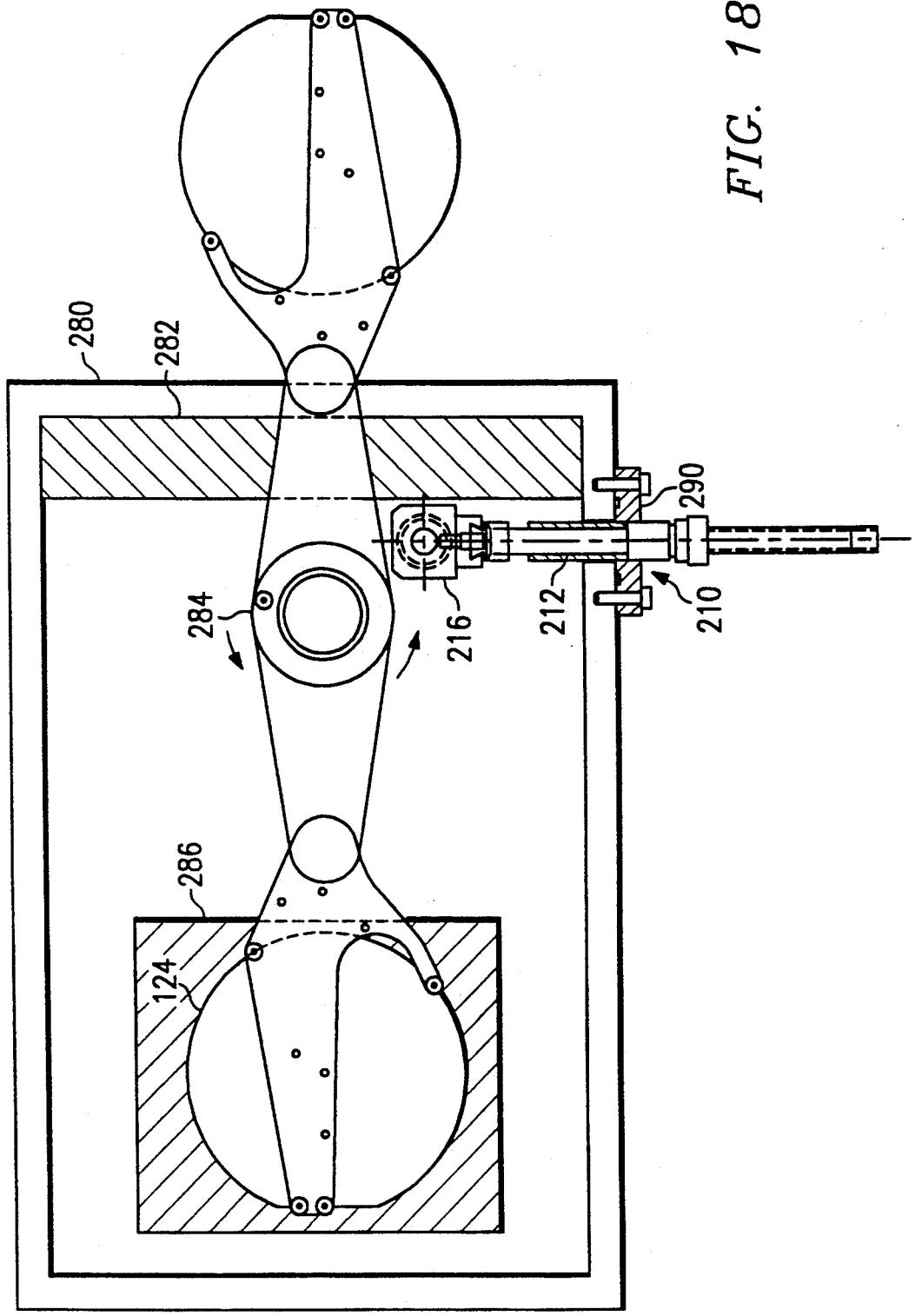
FIGS. 18 and 19 illustrate the implementation of the present invention in a vacuum load-lock chamber of an automatic vacuum processor (AVP) used for single-wafer processing.
Figure 19:
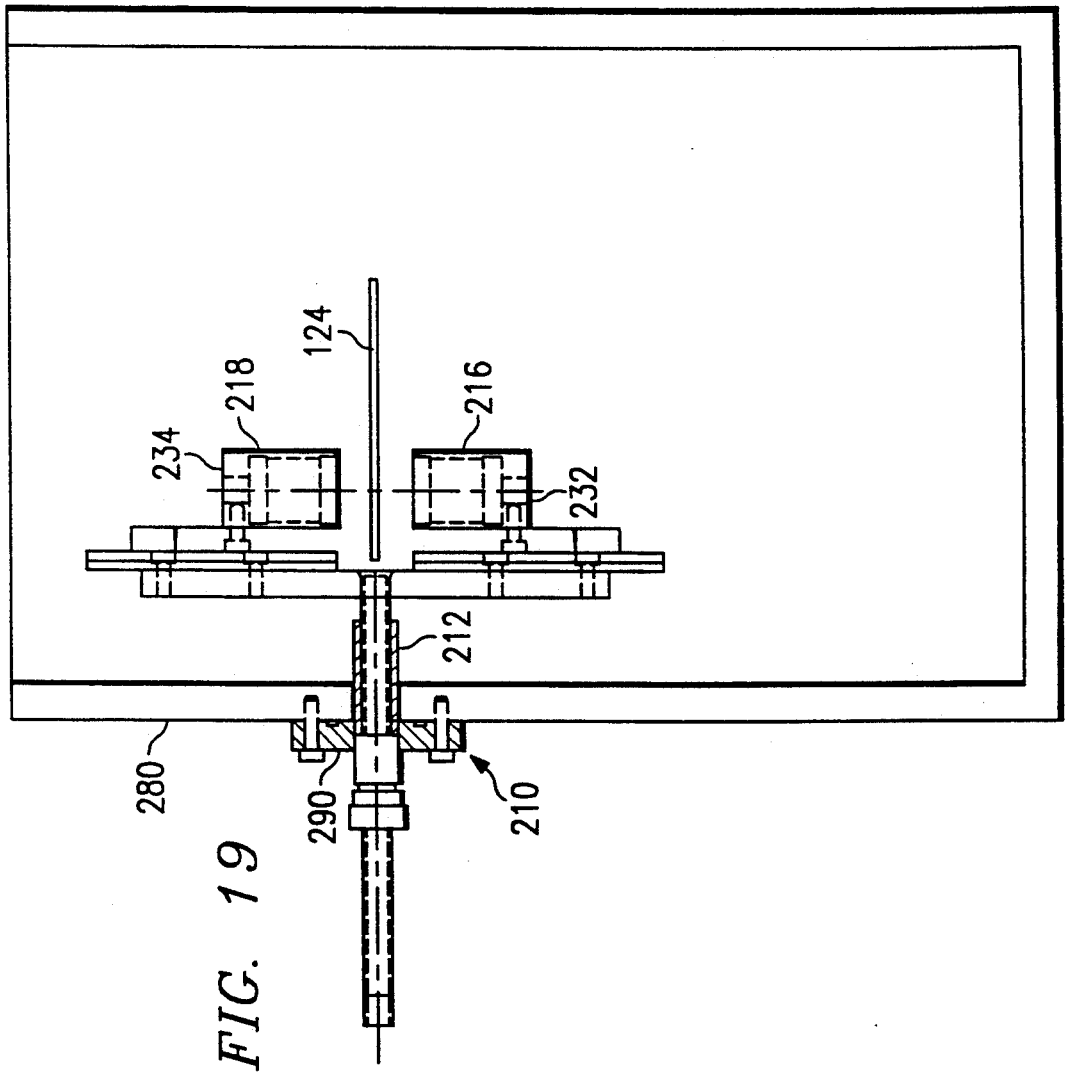
Figure 20:
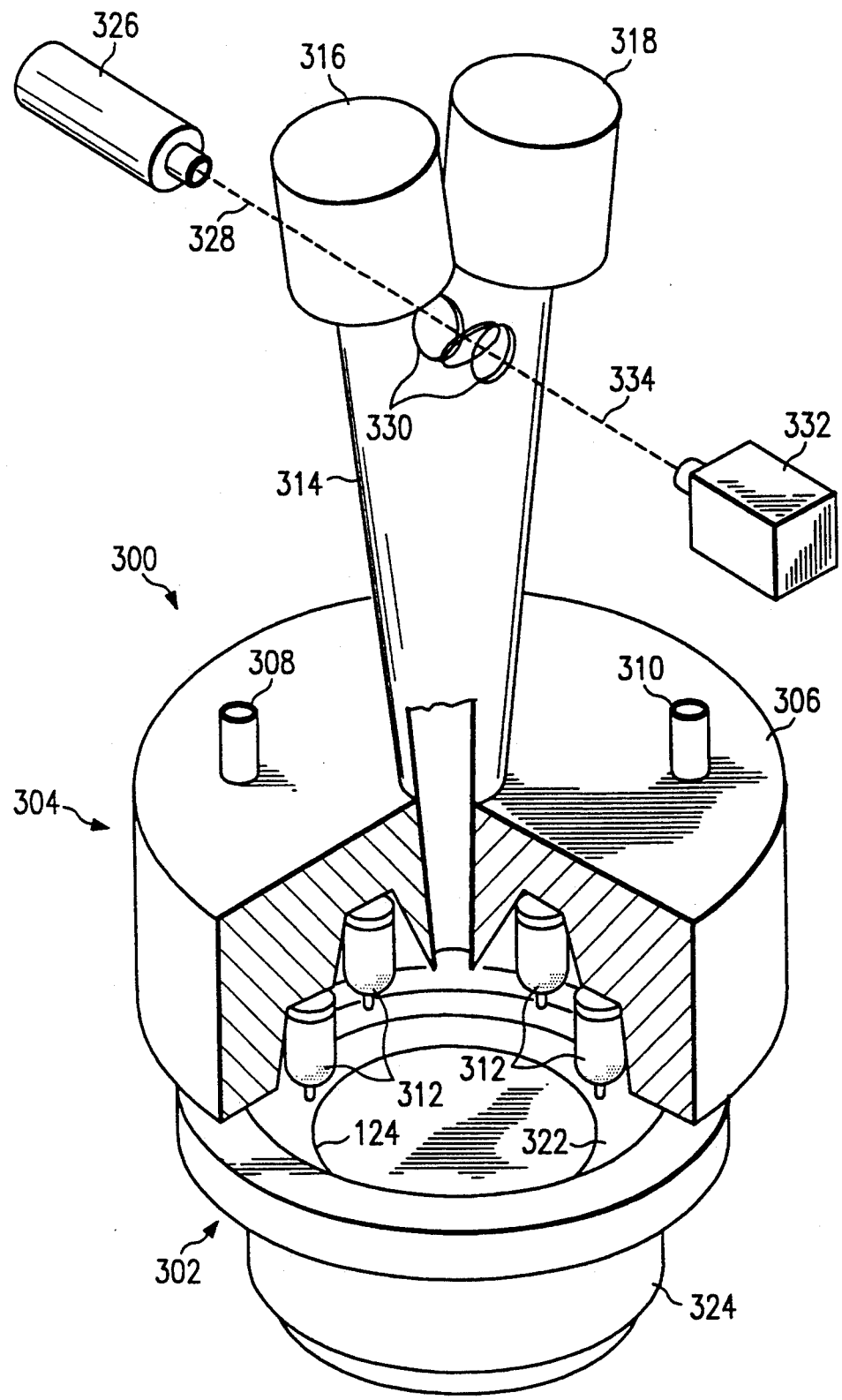
FIG. 20 is a partially cut-away side schematic diagram of a pyrometry-based non-invasive temperature sensor with real time emissivity measurement and compensation which can benefit from the present invention.

The preferred embodiment of the present invention is best understood by referring to the Figures wherein like numerals are used for like and corresponding parts of the various drawings. In the description below, FIGS. 1 through 4 relate to the environment of the present invention. FIGS. 5 through 17 relate to the concepts of the invention, and FIGS. 18 through 20 show use and examples of implementations of the invention.

Semiconductor chip manufacturing factories usually employ well-established statistical process control (SPC) techniques to minimize the process parameter deviations and to increase the device fabrication yield. The conventional fabrication environments rely on controlling a limited set of critical equipment and process parameters (e.g., process pressure, gas flow rates, substrate temperature, radio frequency plasma power, etc.); however, most of the significant wafer, process and equipment parameters of interest are not monitored in real time or in situ. These critical parameters may include conductive layer sheet resistance values, film thicknesses, process uniformity, equipment cleanliness, and others. The existing commercial processing equipment usually lack suitable in-situ sensors for real-time process control and equipment diagnostics applications. In many cases, the wafer processing reactors have not been designed for convenient implementation of new in-situ monitoring sensors. As a result, the detrimental effects of any unexpected process parameter variations and equipment-related drifts are not detected in real time. The relatively long time delays between detection of process or equipment problems and implementation of suitable corrective measures increase the overall chip manufacturing costs.

Vacuum-integrated cluster tools consisting of single-wafer processing modules and in-situ sensors allow sequential integrated device processing in the computer-integrated manufacturing-or CIM-supervised factories. In-situ sensors improve the manufacturing cycle time by eliminating the need for many of the off-line pilot measurements and by enhancing the process and equipment reliability. Moreover, the in-situ sensors employed for equipment and process diagnosis/prognosis will increase the equipment/process up-time and improve the cluster tool reliability and functionality. Real-time in-situ process and wafer monitoring sensors also effectively reduce the process and device parameter spread and result in manufacturing yield improvements.

Figure 1:
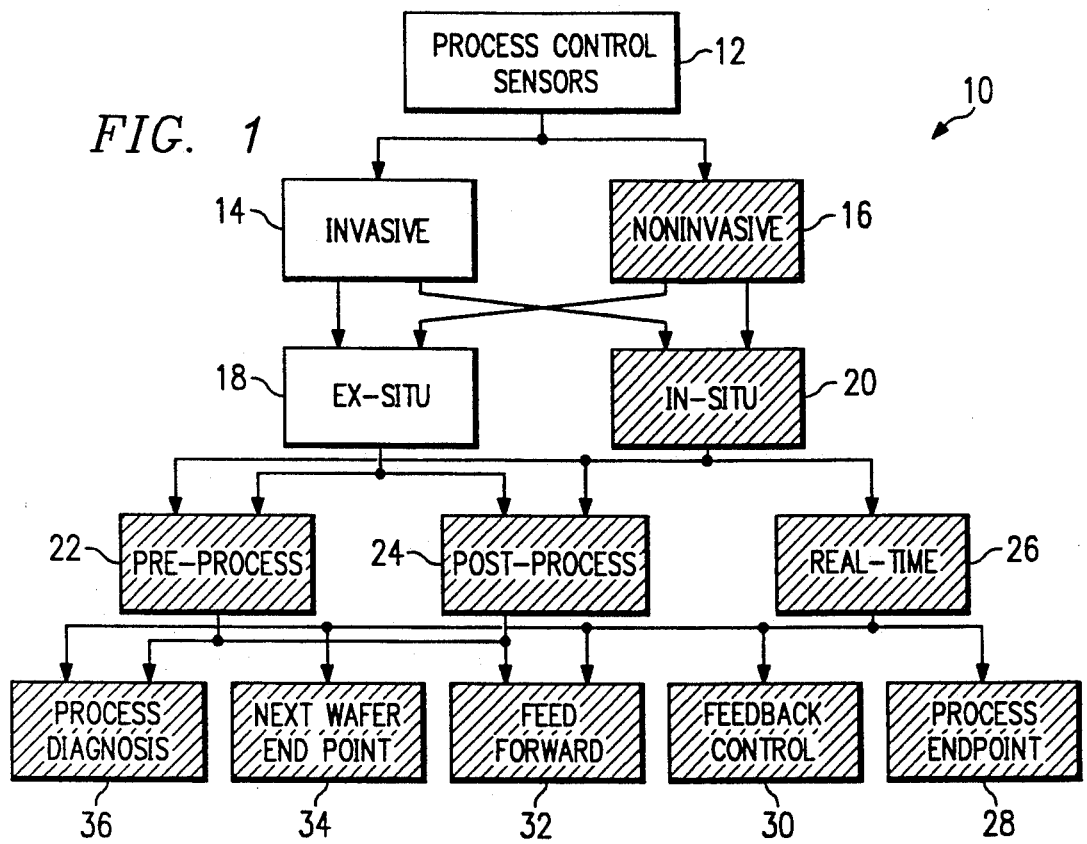
FIG. 1 is a hierarchical diagram of various types of process monitoring and control sensors used in semiconductor device fabrication processes.

FIG. 1 shows a sensor hierarchy 10 diagram for various semiconductor device processing applications. The shaded blocks represent the components which are the most suitable sensor types for advanced manufacturing process control. In general, the process control sensors 12 can be divided into the invasive 14 and non-invasive 16 groups. The invasive sensors 14 are intrusive to the process environment and/or wafer surface within the processing equipment and, as a result, are not suitable for in-situ process monitoring applications 16. For example, most contact-type sensors which require direct mechanical contact with the wafer surface (e.g., four-point probes for sheet resistance and thermocouples for wafer temperature measurements) are invasive. On the other hand, the non-invasive in-situ sensors 20 are the most suitable type for device fabrication process control needs. These sensors usually employ non-invasive probe beams or characteristic detected beams of energy with well-defined physical signatures (e.g., optical, acoustical, electronic, and electromagnetic) to monitor the desired parameters based on a known physical phenomenon. The ex-situ sensors 18 are essentially for off-line pre-process 22 and post-process 24 monitoring applications; however, the in-situ sensors 20 are designed for real-time 26 as well as on-line pre-process 22 and post-process 24 monitoring and process control.

As indicated in FIG. 1, the real-time in-situ sensors 26 are employed for important tasks including process-end-point detection 28, real-time feedback control 30, and process/equipment diagnosis and prognosis 36. For instance, an in-situ real-time sheet resistance sensor can be used in conjunction with a metal CVD process module to provide feedback process control 30 (for instance, to control the deposition rate) and to achieve precise process end-point detection (stop the process whenever the layer sheet resistance is lowered to a pre-specified target value). The same sensor may also provide data to feed-forward links 32 (for instance, sheet resistance or thickness data to a metal etch module) and to expert systems for equipment and process prognosis/diagnosis purposes 36. The in-situ pre-process 22 and post-process 24 sensors are mounted within a load-lock chamber or a dedicated metrology module interconnected with the vacuum-integrated cluster tools. These sensors are useful for next-wafer (delayed) process and end-point control 34, feed-forward links 32, and equipment/process prognosis/diagnosis 36.

The specific choice of various types of in-situ sensors depends on factors such as the application area and cost. For instance, depending on the process application, the tasks of in-situ dielectric thickness measurement may either be performed in real-time (for real-time rate control and/or end-point detection) or following the process by a post-process sensor (for delayed process control and feed-forward links). In general, it is easier and cheaper to design and implement in-situ for pre-process and post-process monitoring purposes compared to real-time in-situ sensors. This is due to the fact that some process modules may impose serious constraints in terms of suitable physical access to the process in wafer environments for implementation of multiple real-time sensors. For instance, real-time dielectric film thickness measurements during a thermal oxidation process are affected by the process temperature (due to the temperature-dependent refractive index values). It is, however, apparent that some tasks such as temperature measurement require real-time sensor operation to achieve meaningful process control.

Figure 2:
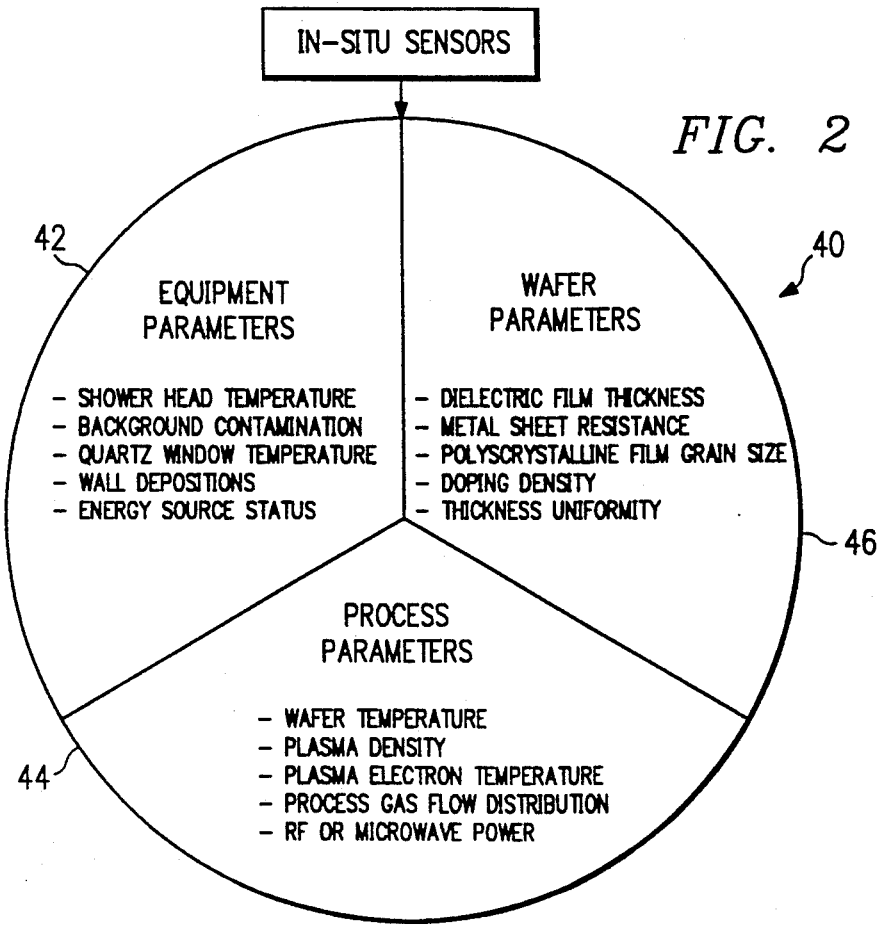
FIG. 2 is a schematic illustration of various parameter domains for semiconductor device manufacturing process control.

FIG. 2 is a schematic illustration of various process domains 40 for process controls using in-situ sensors. These domains associate with the equipment 42, process 44 and wafer 46 parameters. Depending on the specific application, the critical equipment parameters 42 to be monitored may include gas shower head temperature, background contamination, quartz window temperature, chamber wall depositions, and energy source status. Additional equipment parameters are the gas flow rate and pressure settings in a processing reactor. On the other hand, the process parameters 44 are directly governed by both controlled and uncontrolled equipment parameters.

Depending on a specific application, the process parameters 44 which require monitoring may be wafer temperature, process gas flow field, plasma density, and plasma electron energy. In general, a semiconductor wafer exposed to a process contains the most important parameters 46 which have to be controlled. This is due to the fact that the wafer parameters 46 have a direct impact on device performance and yield. For example, in a CVD or PVD (i.e., sputter deposition) process used for deposition of dielectric or conductive films, the important wafer-level parameters 46 may include film thickness, refractive index, stress, conductive layers sheet resistance and thickness uniformity.

Among the above-mentioned three parameter domains 40, the equipment parameters 42 are the easiest to monitor. The equipment parameters 42 can be directly adjusted and monitored by an operator, whereas the process 44 and wafer 46 parameters are usually dependent variables. Monitoring and control of the desired process 44 and wafer 46 parameters require specialized non-invasive in-situ sensors. Proper adjustments of process and wafer parameters are usually performed via varying the equipment parameters. The process parameters are functions of the equipment variables via equipment models and the wafer parameters are determined by the process parameters via process models.

The critical non-invasive in-situ process control sensors required for a given fabrication process are determined based on various considerations such as the impact of the specified process on the overall semiconductor device performance and fabrication yield. The process requirements for a given process indicate if any real-time and/or pre-process or post-process in-situ sensors must be utilized in order to meet the target specifications for process and wafer parameters.

FIG. 3 illustrates various single-wafer processes and their associated "critical" in-situ process control sensors. For example, consider an RTP module used for CMOS gate dielectric formation by rapid thermal growth processes. Thickness, growth temperature, and uniformity of gate dielectrics are the main critical wafer and process parameters which can influence the overall device performance and fabrication yield. As a result, one important sensor is a reliable real-time multi-point temperature sensor for closed-loop temperature control to improve process repeatability and uniformity. Moreover, another very useful sensor is an in-situ ellipsometer for post-process measurement of gate dielectric thickness and refractive index. This sensor will help to further reduce the overall gate dielectric thickness spread via delayed (next wafer) feedback.

An additional post-process in-situ sensor may be used for monitoring the gate dielectric thickness uniformity. The in-situ post-process uniformity sensor will assist in meeting the process uniformity specification and can provide delayed feedback process control information for process uniformity control, assuming the RTP module employs a multi-zone illuminator for dynamic and real-time uniformity control. If the temperature sensor monitors multiple points on wafer for dynamic uniformity control during the gate dielectric formation process, the post-process uniformity sensor will be non-critical.

Figure 3A:
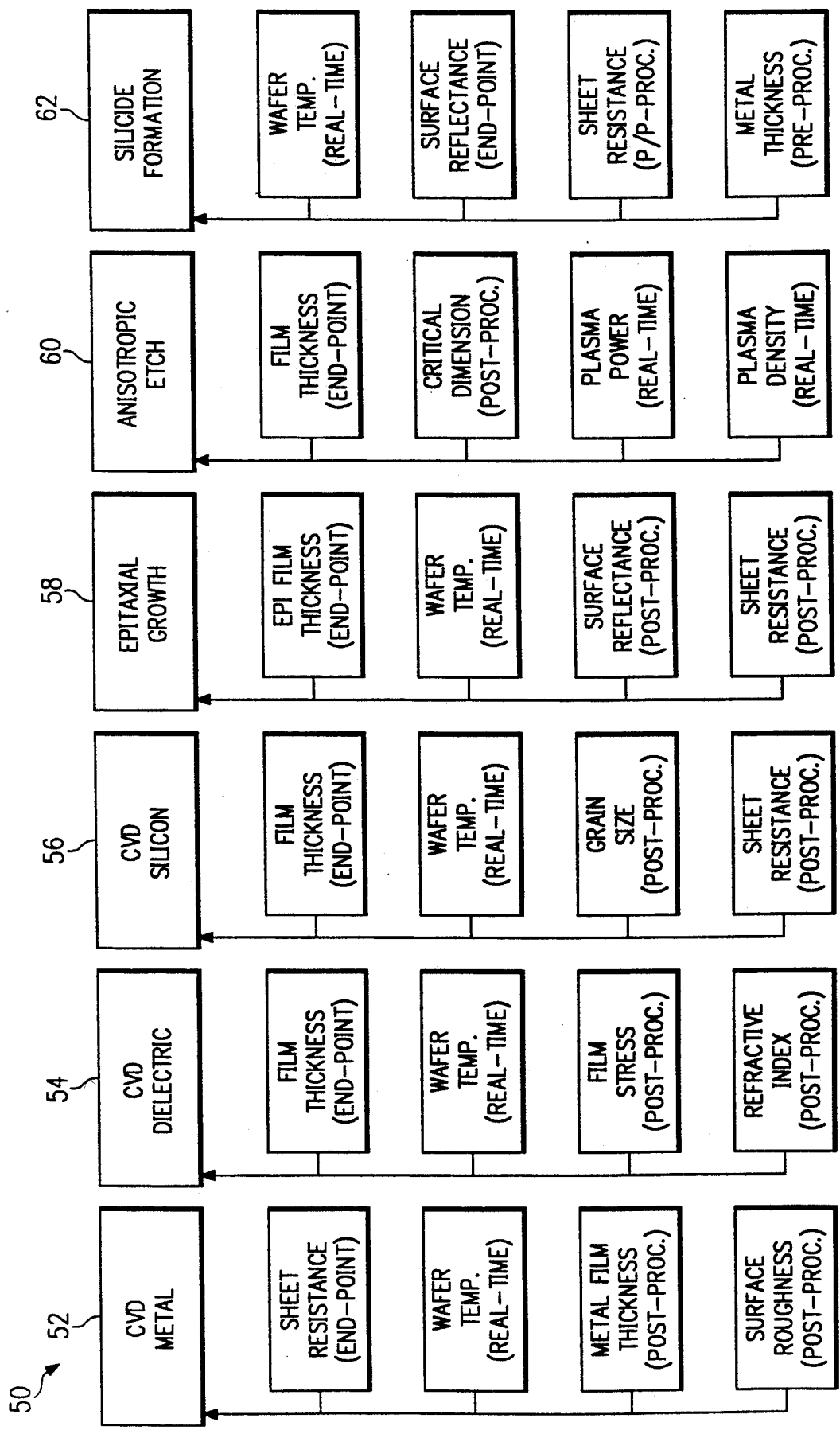
FIGS. 3a and 3b are charts describing useful in-situ sensors for process control in various semiconductor device fabrication processes.
Figure 3B:
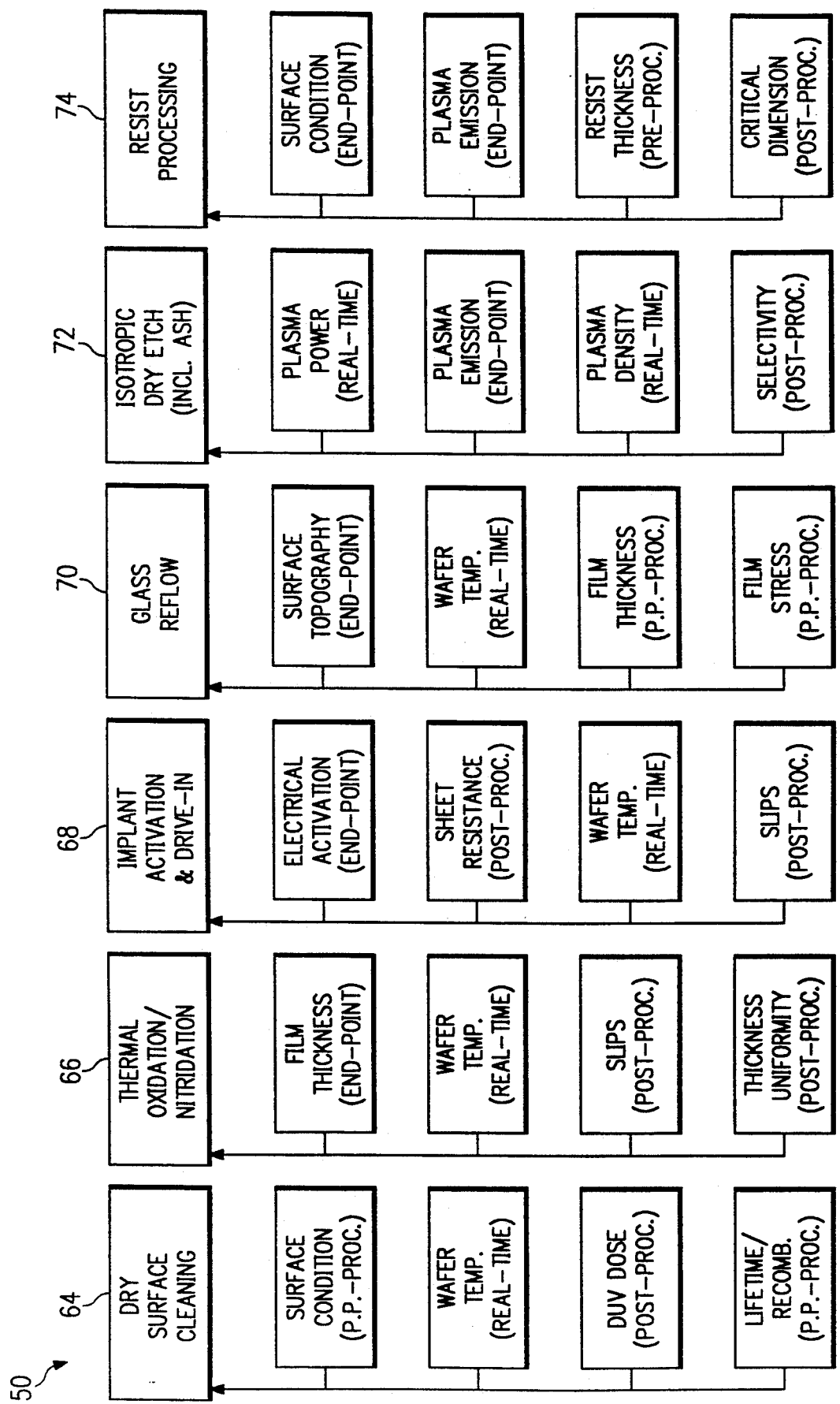

Various blocks shown in FIGS. 3a and 3b illustrate the suggested critical in-situ sensors (real-time as well as pre- and post-process sensors) for CVD processes (metals 52, dielectrics 54, amorphous and polycrystalline silicon 56, epitaxial growth 58, anisotropic plasma etch 60, silicide formation 62, dry surface cleaning 64, thermal oxidation/nitridation 66, ion implant processing 68, glass reflow 70, isotropic plasma etch 72, and resist processing 74). As an example, consider the critical sensor needs for metal CVD processes such as tungsten CVD using lamp-heated CVD modules. Again, a reliable temperature sensor is needed for real-time in-situ wafer temperature control (including uniformity control if a multi-zone illuminator is employed in conjunction with a multi-point temperature sensor).

Precise control of wafer temperature and its uniformity in the CVD tungsten temperature range (300° to 500° C.) is a critical requirement due to its impact on the deposition rate and process uniformity. Another very useful sensor is a non-invasive sheet resistance sensor for real-time in-situ monitoring of tungsten sheet resistance during the deposition process. The sensor will provide the process end-point information and will help to significantly reduce the process parameter spread. Besides these real-time sensors, the process can benefit from two post-process sensors for in-situ (but not real-time) monitoring of the metal film thickness and/or surface roughness.

The use of low-cost in-situ sensors in conjunction with single-wafer vacuum-integrated cluster tools can provide a flexible processing medium for high-yield manufacturing of advanced semiconductor devices. This type of factory relies on intelligent real-time process control based on extensive use of in-situ sensors to minimize the device parameter spread and to enhance the overall equipment reliability and process up-time.

Figure 4:
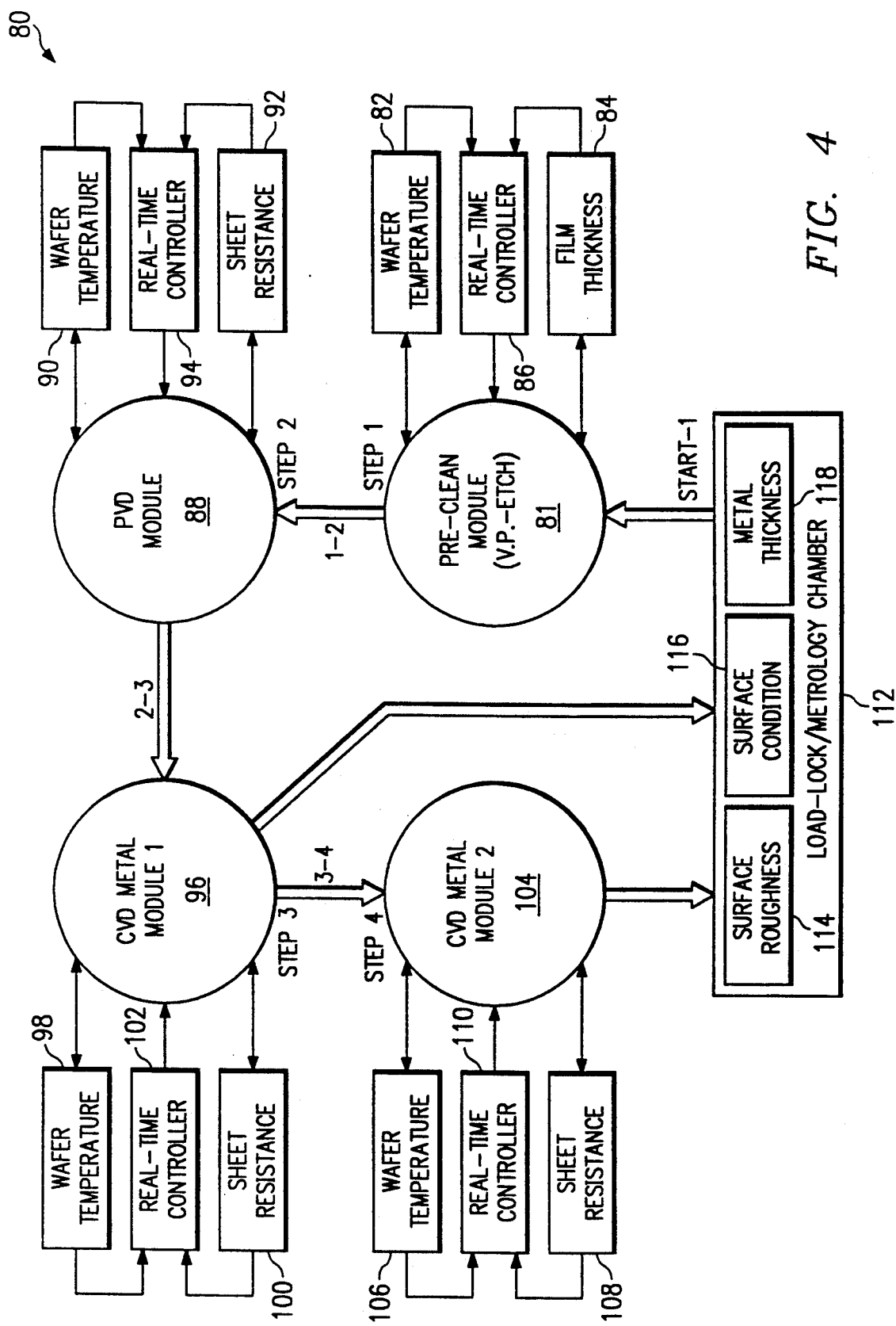
FIG. 4 is a schematic diagram of a representative cluster tool set-up for CMOS device metallization.

FIG. 4 is a schematic diagram of a cluster tool setup 80 for CMOS metallization. The process sequence for metal (such as tungsten metallization) starts with a pre-clean for native oxide removal and continues with applying a layer via physical-vapor deposition (PVD) or sputtering and a CVD metal layer such as CVD tungsten. The critical real-time sensors for this cluster tool are temperature sensors and sheet resistant sensors to determine processed end-point. If necessary, one of the CVD metal chambers may be used for deposition of a barrier layer such as titanium nitride.

For the cluster tool setup 80 of the FIG. 4, the process begins at pre-clean module 82 for which wafer temperature and film thickness measurements take place. Inputs from wafer temperature sensor 82 and film thickness sensor 84 go to a real-time controller 86 which controls the pre-clean module 82. From pre-clean module 82, the next step takes place in a PVD module 88 which includes a wafer temperature monitor 90 and a sheet resistance monitor 92. These monitors input to a real-time controller 94 which controls the operation of the PVD module 88. The next step takes place in CVD metal module 1 96, which includes a wafer temperature sensor 98 and a sheet resistance sensor 100. These sensors input to the real-time controller 102 which controls the operation of CVD metal module 1 96. Next, CVD metal module 2 104 can perform additional CVD metal depositions on the semiconductor wafer. Wafer temperature monitor 106 and sheet resistance monitor 108 take measurements of the semiconductor wafer and feed those values into real-time controller 110. Following processing in CVD metal module 2 104, the semiconductor wafer returns to load-lock/metrology chamber 112. Within load-lock/metrology chamber 112, surface roughness 114 and surface condition 116 measurements are taken. Also, in load-lock/metrology chamber 112, metal thickness measurements 118 are taken and the cycle begins again at pre-clean module 82. Within the load-lock/metrology chamber of a fabrication reactor such as that of FIG. 4, in-situ semiconductor wafer measurements make possible precise process control and end-point determinations.

The method and apparatus of the present invention use coherent optical or electromagnetic energy beam as the medium for measuring semiconductor wafer parameters. By understanding and measuring how a semiconductor wafer affects coherent optical/electromagnetic energy, it is possible to extract properties of the semiconductor wafer and deposited films. An important feature of a semiconductor wafer that affects incident optical or electromagnetic energy is the semiconductor wafer surface condition.

Figure 5:
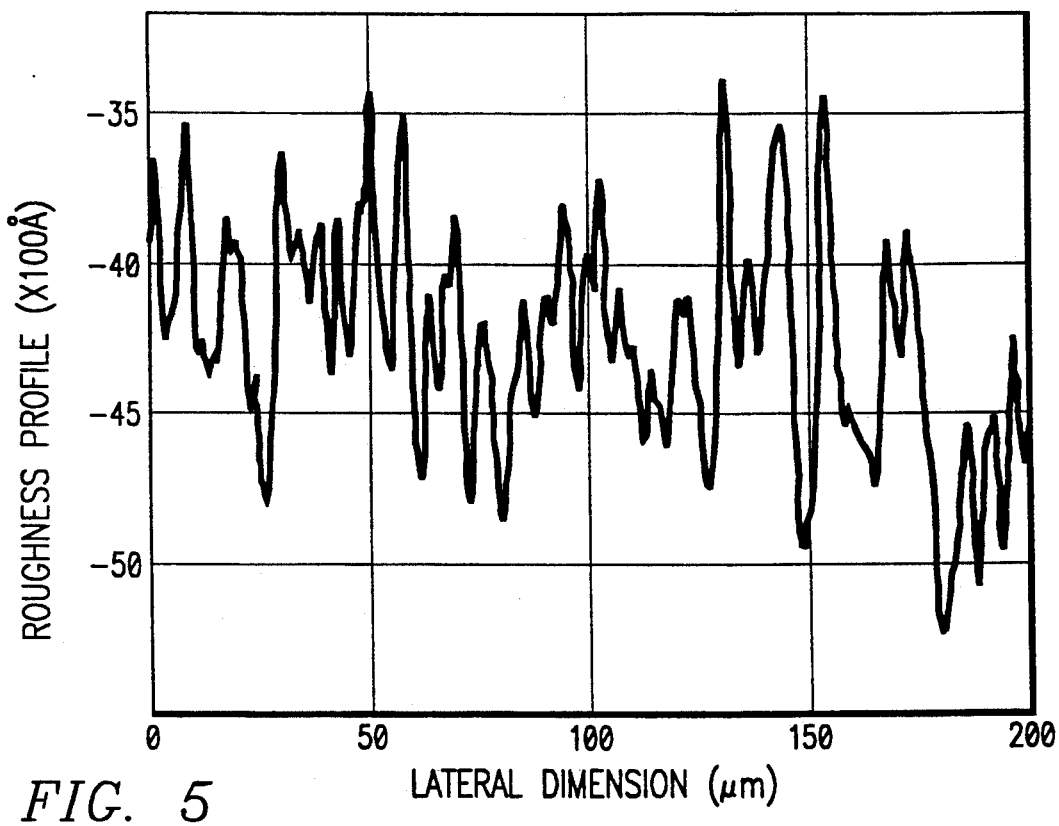
FIG. 5 is a plot of a surface roughness measurement for a layer of chemical-vapor-deposited tungsten on a semiconductor wafer.
Figure 6:
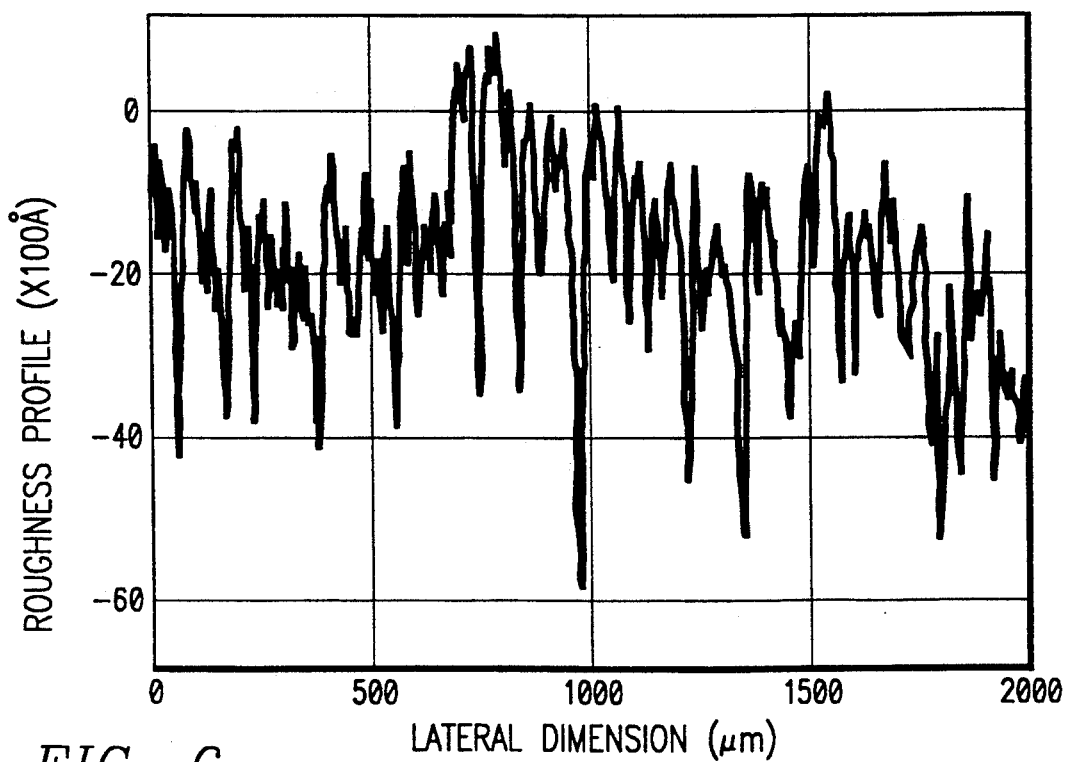
FIG. 6 is a plot of semiconductor wafer backside surface roughness measurement.

FIGS. 5 and 6 illustrate examples of measurements of surface roughness values for a CVD tungsten film deposited on the semiconductor wafer and the unpolished backside surface of a semiconductor surface, respectively. The plot of FIG. 5 shows along the ordinant CVD tungsten RMS surface roughness ranging from approximately $-3500$ to $-5000$ Å and along the abscissa lateral distance from left to right ranging from 0 to 200 $\mu$m. As FIG. 5 illustrates, the CVD tungsten film has a rough surface due to its polycrystalline phase. FIG. 6 illustrates a similar surface roughness profile measurement of silicon wafer backside surface shown between 0 and $-6000$ Å versus the semiconductor wafer backside lateral distance ranging from zero to approximately 2,000 $\mu$m. The measurements of FIGS. 5 and 6 illustrate relatively rough surfaces on the CVD tungsten film as well as on the unpolished backside of the silicon wafer itself. It is these rough surfaces that affect coherent electromagnetic or optical beam reflectance and transmittance. Thus, by measuring the affect that surface roughness has on the specular or coherent surface reflectance and/or transmittance values, it is possible to measure the average or RMS surface roughness itself.

FIG. 7 is a schematic diagram illustrating the relationship between emissivity and reflected and transmitted power components for a highly polished semiconductor wafer surface. A coherent electromagnetic or optical energy source, such as a laser beam 120 having a wavelength $\lambda$ directs a beam of power, $P_i$, onto semiconductor wafer. A portion, $P_r$, of the incident power is reflected (offset for illustration only) by the wafer and a portion, $P_t$, may be transmitted through the semiconductor wafer. The spectral surface reflectance, R, is defined by the following relationship:

$$R = P_r/P_i \quad (1)$$

The spectral transmittance, T, through semiconductor wafer is defined by the following relationships:

$$T = P_t/P_i \quad (2)$$

The spectral emissivity, $\epsilon$, of semiconductor wafer 122 for a given coherent laser beam 120 wavelength, $\lambda$, is given by the following relationship:

$$\epsilon(\lambda) = 1 - R - T = \alpha \quad (3)$$

where $\alpha$ is semiconductor wafer 122 absorption coefficient for the laser beam 120 of wavelength $\lambda$.

FIG. 8 illustrates the situation with an unpolished semiconductor wafer 124 (wafer with one or two unpolished surfaces). Again, a coherent laser beam 120 of wavelength, $\lambda$, directs a beam of power, $P_i$, in the direction of unpolished semiconductor wafer 124. A fraction of the incident power is coherently reflected in a specular beam 26 direction (offset for illustration only) having a power, $P_{cr}$. A portion of incident beam 120 is scattered and reflected from the semiconductor wafer surface over a span 128 having a half angle, $\theta_1$, and a reflected power, $P_{sr}$. Also, a fraction of the incident power may transmit through semiconductor wafer 124. Of that amount, a specular beam 130 of coherent energy and a power, $P_{ct}$, directly emits from the opposite side of the semiconductor wafer 124. The remainder of the transmitted beam energy is scattered by the semiconductor wafer 124 with a scatter beam 132 having a half angle, $\theta_2$, and a transmitted power, $P_{st}$.

From the reflective powers, $P_{sr}$ and $P_{cr}$, a scattering ratio, $S_r$, can be defined as follows:

$$S_r = P_{sr}/(P_{sr} + P_{cr}) \quad (4)$$

Similarly, from the transmitted powers, $P_{st}$ and $P_{ct}$, a transmitted scattering ratio can be determined as follows:

$$S_t = P_{st}/(P_{st} + P_{ct}) \quad (5)$$

To quantify the relationships that exist in the case of a rough or unpolished semiconductor wafer, there are two terms of interest. The first is the root-mean-square (RMS) surface roughness, $\rho$, which is an effective measure of the peak-to-peak variation in surface height. The second variable is called the "coherent length" or "surface coherent length". The coherent length is the scale of the lateral distance over which the roughness profile exists. Empirically, however, from wafer to wafer, the surface roughness varies much more than does the coherent length. Moreover, the coherent length is usually a variable which is dependent on the RMS surface roughness. Consequently, the RMS surface roughness is the main parameter interest in determining semiconductor wafer and CVD film surface roughness measurements.

If the RMS surface roughness, $\rho$, is much less than the wavelength, $\lambda$, of the coherent laser beam, then the total coherent (specular) and scattered reflectance, $P_{cr}$ and $P_{sr}$, respectively, will add to the total reflective power of a similar wafer but without any surface roughness. If, however, $\rho$ is not much less than the laser wavelength, $\lambda$, the net total reflectance of the wafer with at least one rough surface may be different from that of a similar wafer but with polished surfaces. The same considerations are true for the transmittance and emissivity values.

Figure 9:
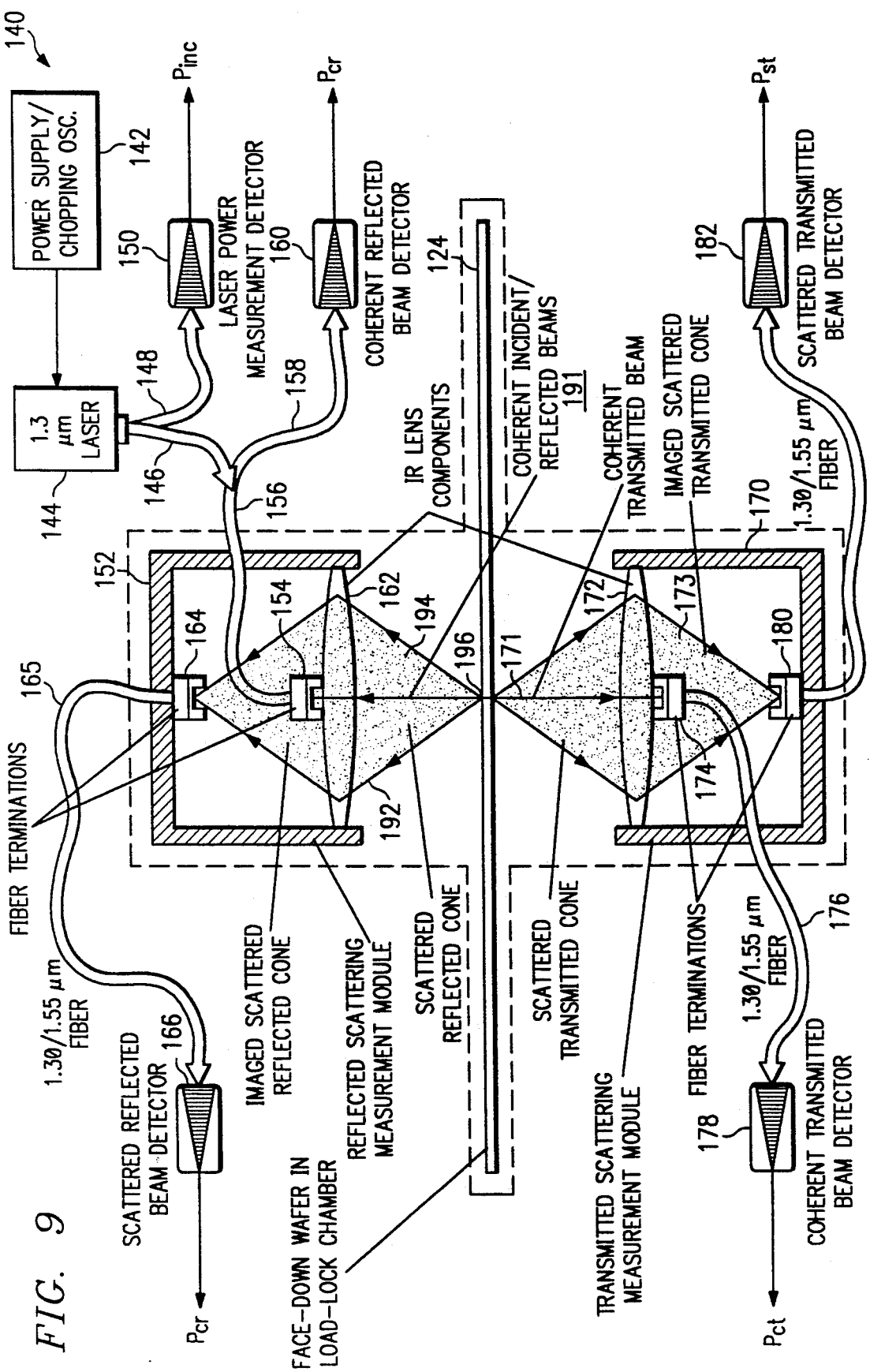
FIG. 9 displays a preferred embodiment of the present invention.

Having explained the relationship between incident coherent electromagnetic energy and a semiconductor wafer, an explanation of the present invention which is a method and apparatus embodying these concepts follows. FIG. 9 displays a schematic diagram of a preferred embodiment 140 of the present invention. In FIG. 9, power supplying oscillator 142 provides power to 1.3 $\mu$m diode laser 144. Laser 144 emits a coherent 1.3 $\mu$m laser beam to fiber optic cable 146. Single-mode fiber optic cable 146 branches to line 148 which connects to laser power measurement detector 150 (a directional coupler may be used instead of the fiber bundle design). Elements within the dash line of FIG. 9 may be placed within a vacuum load-lock chamber. Laser power measurement detector 150 provides a measurement of the input coherent power, $P_{inc}$. Single-mode fiber-optic cable (optical fiber) branch 146 continues as part of fiber optic cable 156 (fiber bundle) through reflected sensor measurement module 152 to fiber termination 154. Fiber bundle 156 contains two optical fibers: a single-mode fiber to guide the incident laser beam generated by laser source 144, and a collecting fiber (multi-mode or single-mode) to collect the coherently reflected laser beam. The collecting fiber continues to become optical fiber 158 and connects to coherent reflected beam detector 160. In the preferred embodiment, reflected sensor module 152 is positioned above semiconductor wafer 124 (face-up or face-down wafer). Fiber termination 154 transmits and receives coherent laser energy. The termination 154 includes a single-mode fiber for delivering the laser beam and another single-mode fiber for collecting the specular reflection beam. A small lens (e.g., less than 2 mm in diameter) is used to collimate the incident beam and to focus the specularly reflected beam onto the collecting fiber. That portion of the laser energy (specular reflection) which fiber termination 154 receives is fed through optical cable 158 which splits off from optical cable 156. After splitting off, fiber-optic cable 158 (collecting fiber for coherently reflected laser beam) provides a detected specular reflected laser beam signal to coherent reflected beam detector 160. The detected laser beam signal provides a measurement of the coherent or specular reflected power, $P_{cr}$. Within reflected beam measurement sensor module 152, fiber termination 154 includes a small collimating lens (not shown). This lens provides a collimated incident laser beam perpendicular to the wafer 124 surface. It also collects and focuses the specular or coherently reflected beam onto the core of a collecting fiber for measurement of the coherent reflected laser beam.

Fiber termination 154 rests on infrared imaging lens 162. Scattered beam imaging lens 162 rigidly mounts within reflected beam measurement sensor module 152 and focuses the scattered portion of the reflected laser power onto fiber termination/collector 164. Reflected beam measurement sensor module 152 also includes fiber termination 164 for receiving scatter reflected energy. The scatter reflected beam fiber termination (collector 164 connects to collecting optical fiber 165 (multi-mode fiber). This fiber 165 guides scatter reflected optical power to scatter reflected beam detector 166. In the preferred embodiment of the present invention, scatter reflected beam detector 166 may be directly and integrally mounted to reflected beam measurement sensor module 152. This allows direct collection and measurement of the scatter reflected beam power without any need for optical fiber 165. Scatter reflected beam detector 166 provides a power signal, $P_{sr}$, to measure the amount of scatter reflected power within reflected beam measurement sensor module 152.

Below semiconductor wafer 124 appears transmitted beam measurement module 170 which is essentially similar to the reflected beam measurement sensor module 152. Transmitted beam measurement sensor module 170 includes scattered beam imaging lens 172 upon which mounts fiber termination and beam collector 174. Fiber termination 174 connects through optical fiber 176 (multi-mode fiber preferred) to coherent transmitted beam detector 178. Termination 174 consists of a small focusing lens which guides transmitted specular beam 171 power into optical fiber 176. Coherent transmitted beam detector 178 provides a measure of coherent (or specular) transmitted power, $P_{ct}$. Fiber termination 180 also mounts within transmitted beam measurement sensor module 170 to collect and measure the amount of scattered transmitted beam from semiconductor wafer 124. Fiber termination 180 collects and guides scattered transmitted beam 173 to scattered transmitted beam detector 182 through multi-mode optical fiber 181. Scattered transmitted beam detector 182 provides an output power signal, $P_{st}$ representing the amount of scattered laser power transmitted through wafer 124. An alternative (preferred) embodiment mounts scattered transmitted beam detector 182 directly on transmitted beam measurement sensor module 170, eliminating the need for optical fiber 181.

Within fiber terminations 154 and 174, a collimating lens collimates the incident laser beam exiting the transmitting fiber. Although the beam from laser 144 was initially collimated, because of multiple reflections within transmitting optical fiber running through branches 146 and 156, there is some beam divergence, typically on the order of 10°-20° half angle upon leaving fiber termination 154. The exact amount of beam divergence depends on the numerical aperture of the fiber. The small collimating lens at fiber termination 154 causes the divergence of the incident laser beam to be significantly reduced so that the beam comes out as a small diameter (e.g., 2 mm) parallel collimated beam with very low divergence. The small collimating-/focusing lens at reflected beam fiber termination 154 also collects and focuses the coherently reflected laser beam onto the receiving fiber connected to coherent reflected beam detector 160. Similarly, a small focusing lens at transmitted beam fiber termination 174 collects and focuses the coherently transmitted laser beam 171 onto the transmitting fiber 176 connected to coherent transmitted beam detector 178. Each of the collimating and focusing lenses is small relative to the scattered beam imaging lenses. For example, if the beam that fiber termination 154 emits is 1.4 mm in diameter, as is the case in the preferred embodiment, its collimating lens should have a diameter of approximately less than 2 mm. Thus, it will be slightly larger than the beam diameter in order to collect all of the coherent or specular beam reflected from semiconductor wafer 124 and to prevent it from spilling over into fiber termination 164. This will ensure negligible signal cross-talk between the specular and scattered detectors. If fiber termination 164 receives some coherent reflected power, as well as scatter reflected power, erroneous scattered reflected beam power measurements will result. The small fiber termination and lens diameters of the termination components 154 and 174 help to minimize shadowing of the scattered reflected and scattered transmitted layer beams. This condition ensures maximum and effective scattered optical signal connection in the reflection and transmission sensors.

Imaging lenses 162 and 172 are each sufficiently large to effectively collect and focus the respective cone of scattered reflected or transmitted optical beams from semiconductor wafer 124.

It is helpful to understand the type of signal that imaging lens 162 of scatter reflected module 152 receives to more fully appreciate the present invention.

Figure 10:
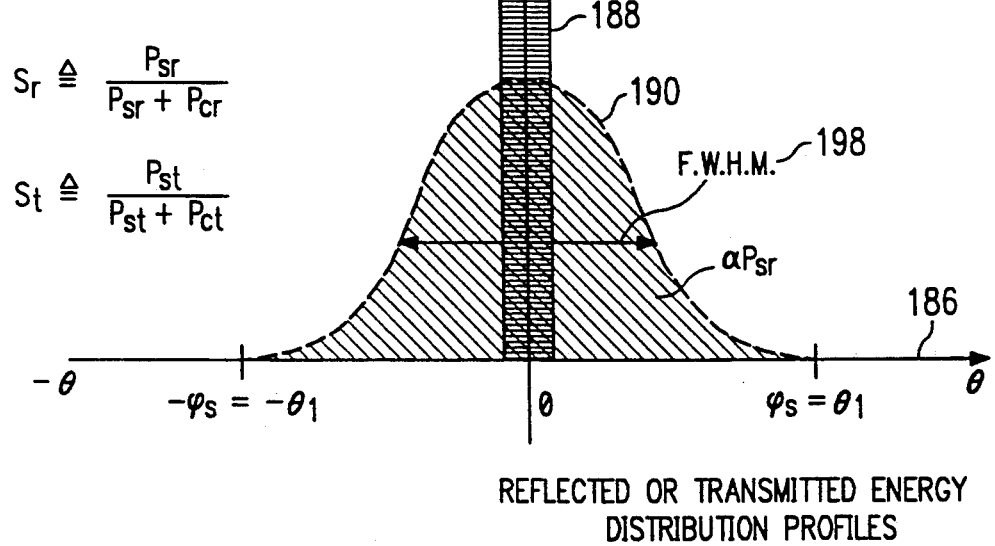
FIG. 10 is a schematic diagram illustrating the spatial distributions of the specular and scattered beam components of the reflected or transmitted optical power versus angle from the specular (perpendicular) direction.

FIG. 10 provides a qualitative plot of the spatial distribution of specular and scattered layer light intensities that reflected beam measurement sensor module 152 receives in response to reflection from semiconductor wafer 124 with a rough backside surface. With the ordinate 184 representing photon density/light intensity and abscissa 186 representing the half space angle from the normal vector to the semiconductor wafer at the point of laser beam incidence (or specular direction), FIG. 10 shows that within a very small angle from the normal, the photon density/light intensity 188 that semiconductor wafer reflects is a measure of the specular or coherent surface reflectance. This value is proportional to the coherently reflected power, $P_{cr}$. FIG. 10 also shows that between the half angle of $\pm\theta_1$ appears a Gaussian (or near Gaussian) distribution of photon density/light intensity. The integrated value of photon density/light intensity within bell curve 190 is proportional to the scattered reflected beam power, $P_{sr}$. Momentarily referring to FIG. 9, it can be seen that the half angle $\pm\theta_1$ is approximately the angle between the line connecting the point 196 of incident laser beam $P_i$, and the outer edge of the scatter reflected energy cone 194 on scattered beam imaging lens 162 and the specular vector normal to the semiconductor wafer at point 196. Returning to FIG. 10, therefore, the Gaussian distribution has the full-width half maximum value 198 approximately as indicated.

An important relationship exists between the RMS surface roughness, $\rho$, the laser beam wavelength, $\lambda$, and the amount of light scattering. If the ratio, $\rho/\lambda$, approaches zero (very large $\lambda$ and/or very small roughness), which occurs when the semiconductor wafer surface becomes increasingly smooth or polished, the scattered reflected beam power approaches zero. Consequently, $P_{sr}$ approaches zero and the scattering ratio, $S_r$, approaches zero.

When absorption and transmission takes some of the incident beam power and $P_{sr}$, approaches zero, $P_{cr}$ approaches its maximum value for a given total surface reflectance. Conversely, as $\rho/\lambda$ becomes increasing large, which occurs when surface roughness increases, the value of $P_{sr}$ increases for a given total surface reflectance of the semiconductor wafer. In any case, as $\rho/\lambda$ becomes increasingly large, coherently reflected power, $P_{cr}$, approaches zero (almost all of the reflected power is scattered).

Figure 11:
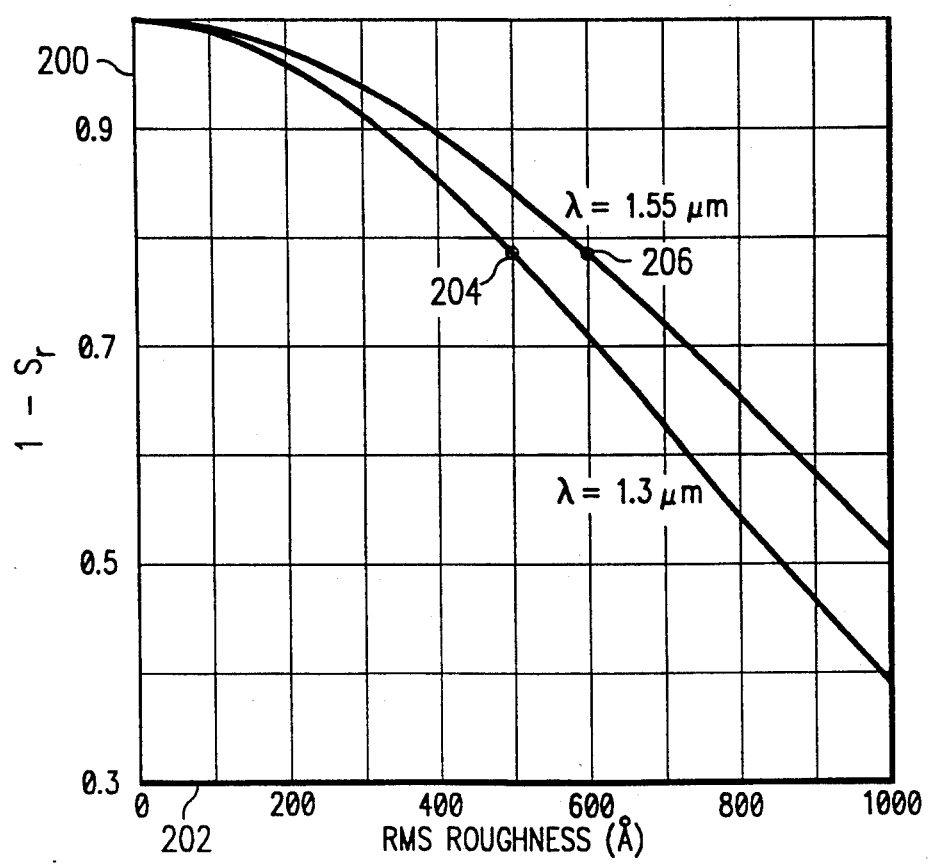
FIG. 11 is a calculated plot of $1-S_r$ versus root-mean-square (RMS) surface roughness of a semiconductor wafer at room temperature; ($S_r$ is the scattering parameter for reflected light beam)

Because $P_{sr}$ and $P_{cr}$ vary as functions of the ratio $\rho/\lambda$, the scattering parameter, $S_r$, can be used to determine the ratio $\rho/\lambda$. For a given wavelength, $\lambda$, and measured scattering parameter, $S_r$, it is possible to determine the RMS surface roughness, $\rho$. FIG. 11 provides a calculated plot of the scattering versus roughness relationship for a laser wavelength $\lambda$ of 1.3 $\mu$m and also a laser wavelength of 1.55 $\mu$m. Along the ordinant 200 of FIG. 11 and ranging from 0.3 to 1.0 appear values for the quantity $1-S_r$, where $S_r$ is the reflectance scattering parameter. Along the abscissa 202 are values of the semiconductor wafer or CVD film RMS surface roughness, $\rho$, ranging from zero to 1,000 Å. The calculations for the plot of FIG. 11 were performed for at room temperature.

An example of the use of FIG. 11 is as follows. Take, for example, the curve associated with the laser beam having a wavelength of 1.3 $\mu$m and a measured value of the one-minus-scattering parameter, $1-S_r$, of 0.79. The plot of FIG. 11 provides an extracted RMS surface roughness of 500 Å indicated at point 204. Likewise, with a laser beam wavelength of 1.55 $\mu$m, the same one-minus-scattering parameter value of approximately 0.79 provides an RMS surface roughness value of 600 Å at point 206. The representative calculated chart of FIG. 11 shows that as RMS roughness ranges from zero to 1,000 Å, $P_{sr}$ increases, causing the scattering parameter $S_r$ to increase to approach 1, thus making $1-S_r$ smaller.

Figure 12:
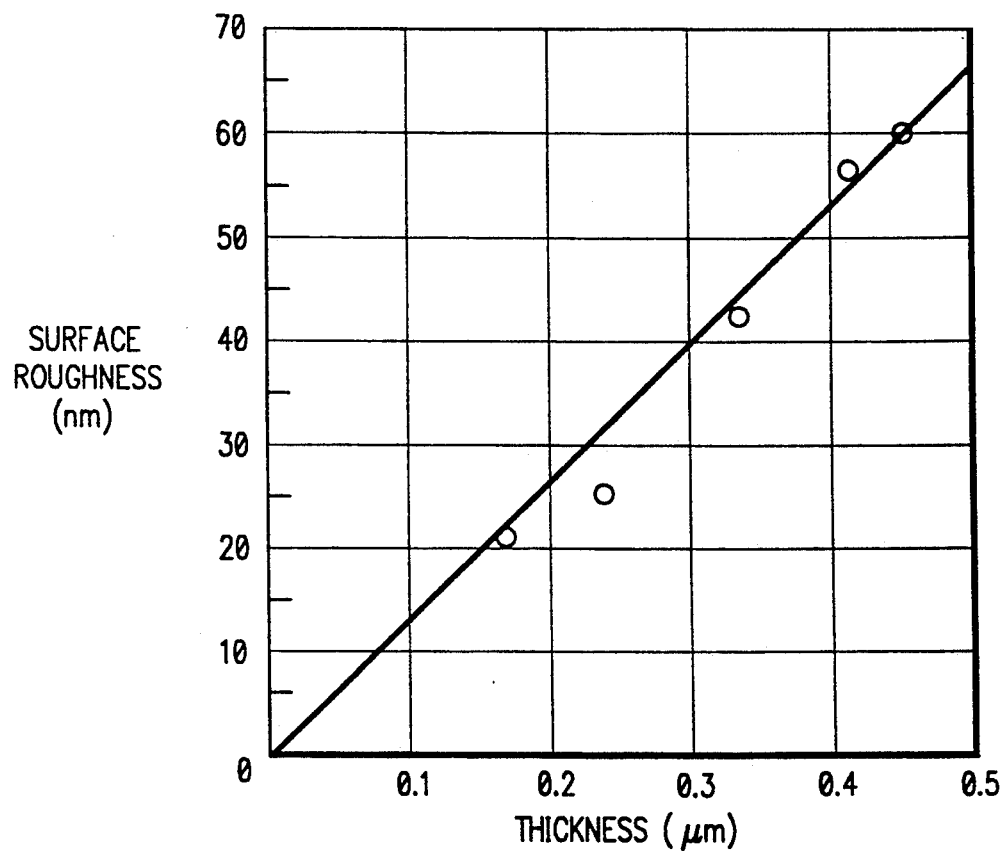
FIG. 12 is a plot of chemical-vapor-deposited tungsten RMS surface roughness versus film thickness.

In T. I. Kamins, et al. "Structure of LPCVD Tungsten Films for IC Applications," *J. Electrochem. Soc.*, December 1986, p. 2555 (hereinafter "KAMINS"), it is shown that when tungsten is deposited on a chromium nucleating layer on an oxidized silicon wafer, surface roughness increases almost linearly with increasing film thickness, and the grain size of the tungsten layer also increases with increasing thickness. The diameters of the largest grains are comparable to the CVD tungsten film thickness. FIG. 12 illustrates this relationship by plotting RMS surface roughness ranging from 0 to 70 nm against tungsten film thickness ranging from 0 to 0.5 $\mu$m. With this relationship, it is possible to determine CVD metal film thickness as a function of scattering parameter, $S_r$. Similar surface roughness versus surface roughness relationships can be obtained for other CVD polycrystalline films such as polysilicon. In summary, therefore, the measurements of coherently reflected power, $P_{cr}$, and scattered reflected power, $P_{sr}$, can determine the thickness of CVD polycrystalline metal as well as other polycrystalline films on semiconductor wafers.

Figure 13:
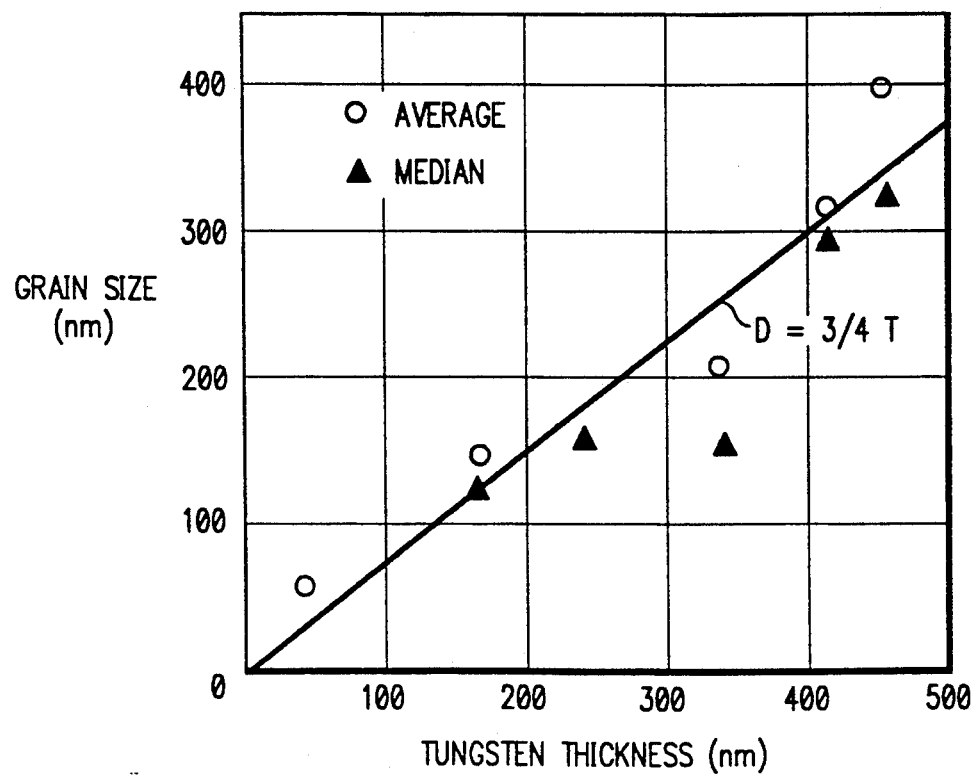
FIG. 13 is a plot of CVD tungsten film average grain size as a function of tungsten film thickness (measured data points)

KAMINS indicates that, at least to a first-order of magnitude, a linear relationship exists between tungsten film thickness and tungsten film average grain size. FIG. 13 illustrates this relationship showing tungsten thickness ranging from 0 to 500 nm and grain size ranging from 0 to 450 nm. FIG. 13 illustrates that with increasing CVD tungsten film thickness, average grain size increases almost linearly.

In determining the reliability of the method and apparatus of the present invention, it is also important to understand the relationship between CVD process temperatures and RMS surface roughness of CVD polycrystalline metal or other polycrystalline layers deposited by the CVD process. Depending on the variance in CVD layer surface roughness with deposition temperature, temperature-dependent calibrations of the roughness-thickness relationship may be necessary. The plot of FIG. 14 shows data for spectral surface reflectance on samples deposited over the temperature range from 250° to 375° C., using either chromium or bulk silicon to promote nucleation of tungsten.

FIG. 14 shows the measured signal, A ($= -2 \log_{10}R$) at a wavelength of 450 nm as a function of CVD tungsten film thickness for samples deposited at different temperatures. The deposition temperature is indicated for each sample. FIG. 14, however, shows that RMS surface roughness increases only as a function of thickness and appears to be relatively independent of the CVD tungsten progress temperature. No significant difference in surface roughness is apparent between the two CVD films that were formed at different temperatures. Because film thickness is more important than process temperature, as long as the process time is adjusted to deposit the film of the desired thickness, surface roughness would be a good measure of the film thickness. This is because the value A shown in FIG. 14 depends on the surface roughness value. With these relationships, it is possible to extend the usefulness of the physical property measurements of the present invention to more complex configurations and an extended range of CVD processes. Even in CVD processes where the surface roughness for a given film thickness is dependent on the deposition temperature, it is possible to set up calibration look-up tables for a range of temperatures.

Figure 15:
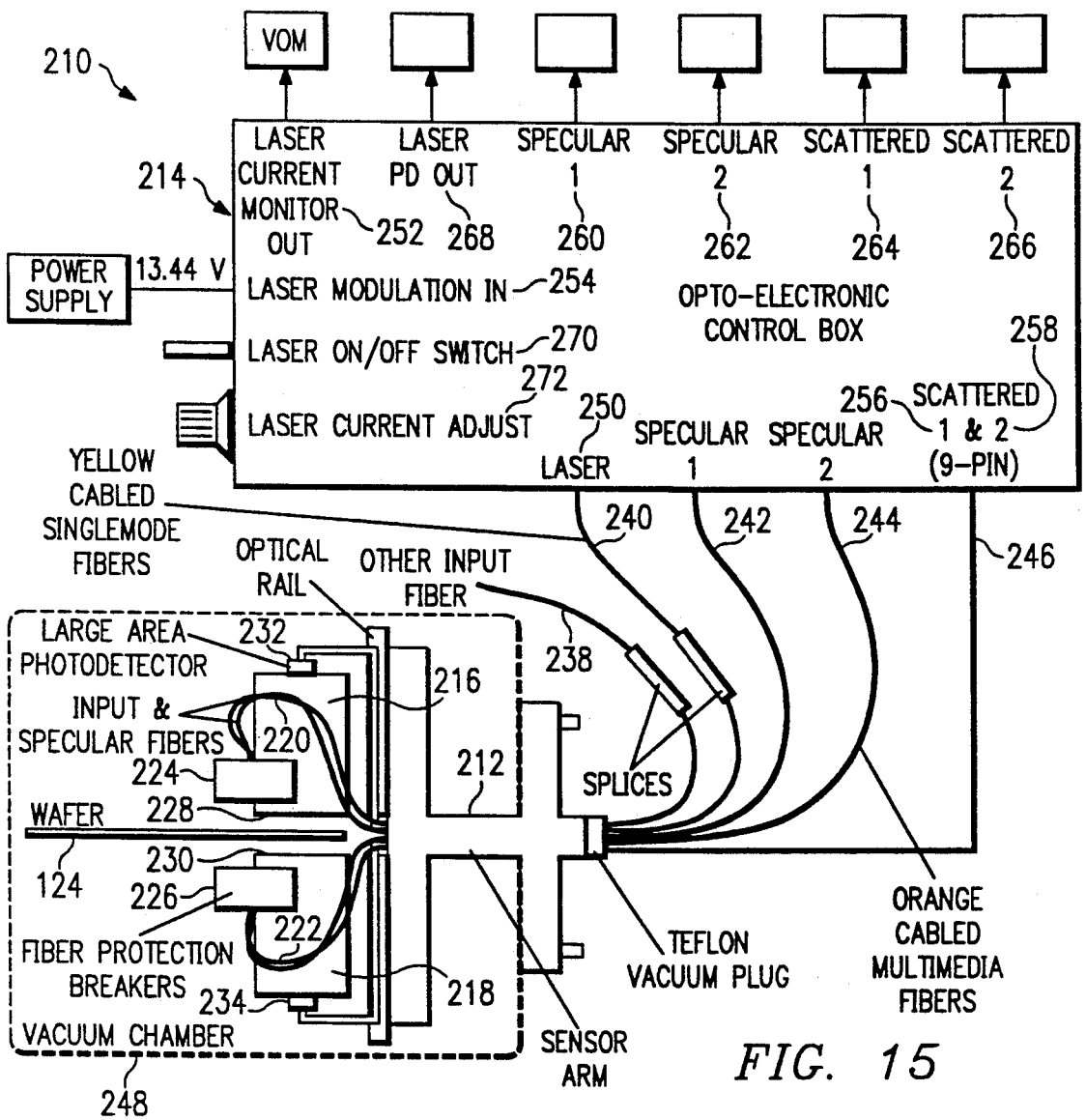
FIG. 15 shows a schematic diagram of a fiber-optic scatter sensor system incorporating the preferred embodiment of the present invention.

A schematic diagram of FIG. 9 has been embodied in a scattering sensor system that FIG. 15 describes. The surface roughness system 210 of FIG. 15 is comprised of a sensor arm 212 and an opto-electronic control box 214. The sensor arm 212 consists of two essentially identical sensor heads 216 and 218 facing each other. Each sensor head 216 and 218 contains two-fiber optical cables 220 and 222, aspherical collimating focusing lenses at 228 and 230, scattered light focusing lenses at 228 and 230, and large area germanium photodiode devices 232 and 234, all respectively. The two laser transmitting optical fibers 238 and 240 and the specular photodiode fibers 242 and 244 for sensor heads 216 and 218, respectively, are routed through the sensor arm 212 in load-lock chamber 248 and connect to opto-electronic control box 214, where they are cabled and connectorized. The opto-electronic control box 214 contains outputs for monitoring the driving current of a 1.3 μm laser diode 252, laser drive and modulation interface circuit 254, two InGaAs photodetectors (not shown) for specular beam measurements, and outputs for the two specular 260 and 262, two scattered 264 and 266, and the laser diode's internal photodetector signals 268. Electrical cable 246 carries the scattering detector signals to opto-electronic control box 214.

To fabricate the system of FIG. 15, various components may be used. Parts which must be separately machined include sensor support arm 212, sensor heads 216 and 218, and holders for the collimating and focusing as well as scattered beam lenses. However, the preferred embodiment of the present invention uses the commercially available components listed in Table 1 as follows:

TABLE 1

| Part Names | Source | Part No. | Qty |
| --- | --- | --- | --- |
| Translation Carrier | Newport | MTF | 2 |
| Optical Rail | Newport | MRL-9-VC | 2 |
| Aspheric Lens Holder | — | — | 2 |
| Aspheric Lens | Rolyn Optics | 17.1010 | 2 |
| Biconvex Lens | Newport | XBX043-AR18 | 2 |
| Germanium Photodetector | Gs. Power Devices | GM-8 | 2 |
| Ceramic Adhesive | Aremco | 569 | 1 oz |
| FC-PC SMF Cable | Ficon | 5-08-6B-6B-3 | 3 m |
| 100/140 S1 Cable Fiber | Spectran | — | 3 m |
| Teflon Vacuum Plug | — | — | 1 |
| 125 μm ID Capillary Splice | NEO | — | 2 |
| Electronics Box | ITT Pomona | — | 1 |

TABLE 1-continued

| Part Names | Source | Part No. | Qty |
| --- | --- | --- | --- |
| FC Connectorized 1.3 μm LD | MRV | MRLD-FC-1 | 1 |
| ST Connectors | ETS | STC-B140-2151 | 2 |
| ST Receptacles | ETS | 300-4STC-0001 | 2 |
| Isolated BNC Connectors | — | — | 7 |
| ON/OFF Switch | — | — | 1 |
| 1K Potentiometer | — | — | 1 |
| 9-pin Connector | — | — | 1 |
| InGaAs Photodectector | Fujitsu | FTD12Z32TU | 2 |

The system 210 of FIG. 15 uses DC drive or AC drive/modulation of the laser diode for semiconductor wafer measurements. The sensor system 210 has symmetrical heads. It is possible to guide the laser beam either towards the lower sensor head (fiber 240) or towards the upper sensor head (fiber 238). Operation of the system 210 to determine the coherent and scattered reflection and transmission of a semiconductor wafer is straightforward once the laser diode current is set and the wafer holder aligns and FIG. 16 shows the schematics of the laser diode drive and specular photodetector circuits. AC modulation of the laser source may be performed in order to enhance the signal-to-noise and measurement accuracy by lock-in amplification.

To set the laser diode 144 current, the following steps are performed:

Laser switch 270 is turned off, and the laser current potentiometer 272 is set to a minimum value. A high impedance voltage meter connected to the laser current monitor 252 output and an optical power meter, may be connected to all five photodetector outputs (260 through 268). Finally, a laser drive modulation source such as a DC or an AC power supply is connected to the laser modulation input 254. At this point it is important to assure that the maximum output voltage of the modulation source with a 220 ohm load does not exceed 13.44 volts. It is important to note that the load on the modulation source is in the range of 220 to 1220 ohms, depending on the laser current potentiometer. Next, it is necessary to connect one of the laser output cables 240 or 258 to the sensor. The next step is to turn laser switch 270 on.

The laser current monitor should have a peak voltage of about 2.24 volts and the laser photodiode should have an output of around 1.77 microamps. The next step is to turn up the laser current slowly to a maximum, while making sure that the peak laser current monitor voltage does not exceed 11.66 volts. The laser pulse diode 268 should have an output of about 250 microamps.

Preliminary characterization results using test wafers in the scattered sensor system of FIG. 15 are shown in Table 2 below:

TABLE 2

| Sample # | Wafer Side Toward Input | Laser Input Side # | Spec 1 | Spec 2 | Scat 1 | Scat 2 | Comments |
| --- | --- | --- | --- | --- | --- | --- | --- |
| None | — | None | −5 pA | −7 pA | 50-250 pA | 50-250 pA | Dark Currents |
| None | — | 1 | −106.6 μA | −633.3 μA | −5.295 μA | −3.379 μA | Can be used as Reference Levels |
| None | — | 2 | −750 μA | −4.20 μA | −4.20 μA | −7.25 μA | Can be used as Reference Levels |
| Si-1 | Polished Front-Side | 2 | −30 μA | −251.9 μA | −145.1 μA | −60.08 μA | |
| Si-1 | Rough Backside | 1 | −179 μA | −26.37 μA | −44.56 μA | −137.0 μA | Bare Silicon Wafers |
| Si-2 | Polished Front-side | 2 | −33.58 μA | −252.8 μA | −144.3 μA | −58.14 μA | |
| Si-2 | Rough | 1 | −38.48 μA | −28.84 μA | −119.5 μA | −139.2 μA | |

TABLE 2-continued

| Sample # | Wafer Side Toward Input | Laser Input Side # | Spec 1 | Spec 2 | Scat 1 | Scat 2 | Comments |
|---|---|---|---|---|---|---|---|
| CVD-W (1) on Si | Backside Glossy (metal) | 2 | 13 pA | −472 μA | −1.4 nA | −111.11 μA | CVD tungsten on Silicon Wafers |
| CVD-W (2) on Si | Glossy (metal) | 2 | 14 pA | −365 μA | −1.2 μA | −27.9 μA | |

The photodetector currents that Table 2 shows were obtained when the laser current monitor output was set at 10.75 volts.

To operate the apparatus of the present invention, the wafer must be properly located equidistant between the sensor heads and tilt of the semiconductor wafer must be reduced to as close to zero as possible to assure that all the specular energy is collected by the focusing lenses and does not occur, a significant error and signal cross-talk results in reflectance and transmittance as well as scattering parameter measurements.

Figure 17:
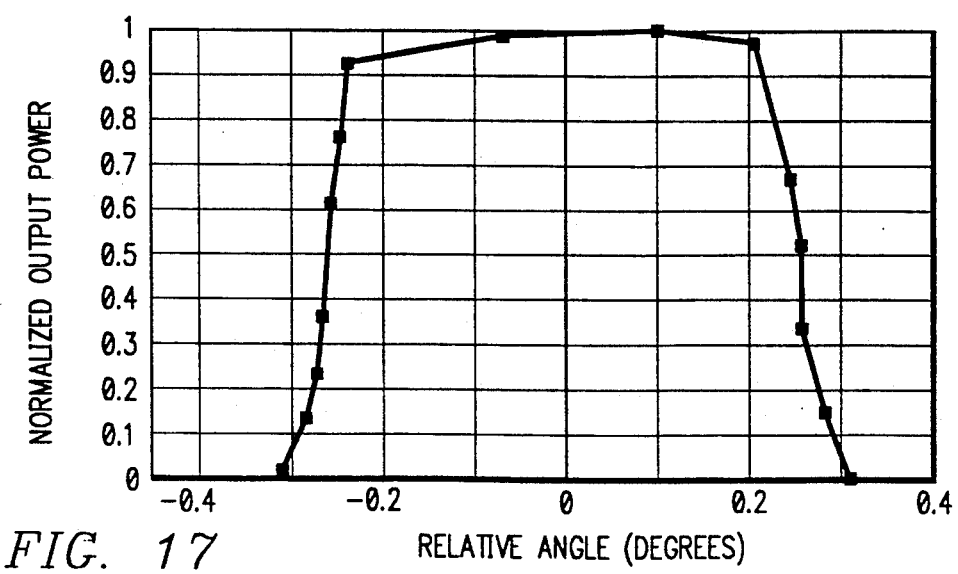
FIG. 17 is a plot of the specular reflection as a function of wafer tilt using the system of FIGS. 15 and 16 (measured data points)

FIG. 17 provides a plot of specular reflection as a function of wafer tilt to provide preliminary characterization results using sample wafers and the system 210 of the FIG. 15 embodiment. Along the ordinant of FIG. 17 shows the measured normalized specular power signal from sensor head 216 ranging from 0 to 1; the abscissa shows relative wafer tilt angle in degrees from −0.4 to +0.4 with respect to the actual normal vector or specular vector for the wafer at the point of incident power. FIG. 17 shows that within the range of approximately −0.2 to approximately 0.2 degree tilt angle virtually all of the specular output power for the coherent reflected or transmitted laser beam is collected by specular fibers 220 and 222. As FIG. 17 illustrates, with the system 210 of FIG. 15, as long as the relative tilt angle at least falls within ±0.2 degree, all of the specular or coherent reflected and transmitted beam powers that the semiconductor wafer reflects and transmits will be sensed as specular inputs to specular fibers 220 and 222.

In aligning a wafer holder to the sensor heads 216 and 218, the following steps are taken. First, place a polished silicon wafer on the holder and position it between the heads 216 and 218. Next, connect the laser 1 cable 238 to the laser output 268 and optimize the wafer tilt to maximize the specular 1 260 output. Next, connect the laser 2 cable 240 to the laser output 268 and, if necessary, fine tune the wafer tilt to peak the specular 2 output 262. Reiteration of the previous connection steps may be necessary to obtain the optimal tilt for both laser input directions.

To provide a path for maintaining proper wafer position and tilt for surface roughness measurements, the present invention may be implemented in a load-lock or dedicated sensor chamber. FIGS. 18 and 19 illustrate implementation of the sensor system of the present invention within a load-lock chamber of an Automated Vacuum Processor (AVP) manufactured by Texas Instruments of Dallas, Tex. FIG. 18 provides a top down view of the sensor system of the present invention implemented in an automated vacuum processor or AVP load-lock chamber. Within load-lock chamber wall 280 appear process chamber isolation gate mechanism 282, wafer handling robot 284, and wafer boat 286. Wafer handling robot 284 picks up a single semiconductor wafer 124 at metal boat 286 and by rotation transports wafer 124 through load-lock chamber 280 and isolation gate mechanism 282 to have the wafer 124 enter into a semiconductor wafer process chamber (not shown) of a fabrication reactor. Through vacuum tight seal 290, the sensor system 210 of the present invention penetrates into load-lock chamber 280.

As wafer handling robot 284 passes semiconductor wafer 124 through load-lock chamber 280, semiconductor wafer 124 passes by sensor system 210 between sensor heads 216 and 210. FIG. 19 illustrates the passage of semiconductor wafer 124 through the sensor heads 216 and 218 to establish the point at which RMS surface roughness measurements can be made using the method of the present invention. This sensor system can also perform multi-point measurements on a wafer. It is also possible to employ two diode laser sources with the sensor system of this invention in order to provide laser beam power simultaneously to the two sensor heads. The two laser sources may be modulated at two different frequencies. The two-frequency modulation will allow simultaneous measurements of the reflectance, transmittance, spectral emissivity, and scattering parameter values for laser beams incident on both sides of a semiconductor wafer. This approach, for instance, allows simultaneous measurements of the CVD polycrystalline film thickness and wafer backside roughness on a wafer with a CVD polycrystalline film. The use of two different frequencies (frequency-division multiplexing or FDM) permits these simultaneous measurements without any signal cross-talk. It is also possible to use time-division multiplexing (TDM) of the two incident laser beams in order to perform simultaneous measurements without signal cross-talk. In the case of FDM, each detector channel contains an electrical signal with two frequency components. These signals can be easily separated by filtering.

A straight-forward application of the RMS surface sensing system 210 of the present invention in conjunction with an in-situ real-time semiconductor wafer fabrication system can significant improve process monitoring and performance. For example, FIG. 20 illustrates a schematic diagram of an advanced temperature sensor 300 designed and developed for the temperature range of 300° to 1200° C. The temperature sensor of FIG. 20 is described in more detail in U.S. Pat. No. 4,956,538 to Mehrdad M. Moslehi entitled A METHOD AND APPARATUS FOR REAL-TIME WAFER TEMPERATURE MEASUREMENT USING INFRARED PYROMETRY IN ADVANCED LAMP-HEATED RAPID THERMAL PROCESSING which is incorporated by reference herein. Essentially, the temperature sensor 300 of FIG. 20 comprises a first and second pyrometer, 316 and 318, respectively, which are optically coupled by a light pipe 314 to a semiconductor wafer 124. The light pipe 314 passes through a shroud 306 of a heating lamp module 304. A computer is interconnected to the pyrometers 316 and 318 and a lamp module power supply. A laser 326 emits a laser beam 328 through a power meter onto an infrared mirror 330 over light pipe 314. The mirror 330 directs the beam 328 onto the semiconductor wafer 124 which reflects a portion 334 of the beam 328 back to the infrared mirror 330. The beam 328 is then guided to an infrared photodetector 332 which provides, in combination with the incident laser beam power meter, reflectance of the semiconductor wafer 124 surface for the laser beam 328 which is related to semiconductor wafer emissivity.

The spectral infrared emissivity measurement can be performed more accurately over an extended temperature range if the transmissivity of the semiconductor wafer 124 is determined by another infrared photodetector and both the measured wafer reflectance and transmissivity data are used to calculate the emissivity. Semiconductor wafer emissivity data and pyrometer reading data are evaluated by the computer to determine the true wafer temperature in real time and to raise or lower the power output from the power supply to adjust the semiconductor wafer temperature within the apparatus. The temperature sensor system 300 of FIG. 20 works well provided semiconductor wafer 124 is double polished. However, if the backside of semiconductor wafer 124 has a significant value of RMS surface roughness, this will affect the accuracy of temperature measurements.

The sensor system 210 of the present invention, however, can provide in-situ RMS surface roughness measurements that can be used to calibrate the temperature system 300 of FIG. 20. By determining backside roughness for a semiconductor wafer prior to its entering the process chamber, this measurement can be used to calibrate the data that the sensor system of FIG. 20 generates. As a result, the sensor system 300 of FIG. 20 and the sensor system 210 of the present invention can provide real-time measurements of spectral emissivity at any process temperature. Moreover, not only can the sensor system 210 of the present invention assist in producing temperature results that are calibrated to compensate for the effects of surface roughness, but also it can improve other real-time sensors by providing this type of information for measurement correction.

Although the invention has been described with reference to the above specified embodiments, this description is not meant to be construed in a limiting sense. Various modifications of the disclosed embodiment, as well as alternative embodiments of the invention will become apparent to persons skilled in the art upon reference to the above description. It is therefore contemplated that the appended claims will cover such modifications that fall within the true scope of the invention.

What is claimed is:

1. A sensor for semiconductor device manufacturing process control wherein said semiconductor device is on a semiconductor wafer comprising:
a coherent electromagnetic beam energy source;
a fiber optic network associated with said energy source, said fiber optic network including a fiber termination for directing coherent electromagnetic beam energy in the direction of the semiconductor wafer and for receiving coherent electromagnetic beam energy reflected from the semiconductor wafer in a specular direction;
a first receive sensor element connected to said fiber termination for measuring the coherent electromagnetic beam energy reflected in the spectral direction as coherent beam power;
a second receive sensor element for measuring electromagnetic beam energy reflected as scattered beam power from the semiconductor wafer, said second receive sensor element measuring simultaneously with said first receive sensor element;
a lens for focusing said electromagnetic beam energy reflected as scattered beam power to said second receive sensor and disposed between said semiconductor wafer and said fiber termination; and
circuitry of determining semiconductor wafer surface roughness based on the measurements of said beam energy reflected as coherent beam power and reflected as scattered beam power.

2. The apparatus of claim 1, further comprising:
a transmit sensor element for measuring the amount of electromagnetic power coherently transmitted through the semiconductor wafer in the specular direction and the amount of electromagnetic power scatter transmitted through the semiconductor wafer, and wherein said determining circuitry further includes circuitry for including said coherently transmitted power and scatter transmitted power in determining said semiconductor wafer surface roughness.

3. The apparatus of claim 2, wherein said transmit sensor element comprises a specular transmission sensor for receiving said coherently transmitted electromagnetic power and a scatter transmission sensor for detecting said scatter transmitted electromagnetic power, said scatter transmission sensor comprising an imaging lens for focusing said scatter transmitted electromagnetic power to said scatter transmission sensor.

4. The apparatus of claim 3, wherein said specular transmission sensor further comprises an imaging lens for focusing said coherently transmitted electromagnetic power to said specular transmission sensor.

5. The apparatus of claim 1, wherein said sensor operates in a semiconductor wafer processing reactor.

6. The apparatus of claim 1, wherein said coherent laser energy source emits coherent energy in the range of 0.4–15 $\mu$m.

7. The apparatus of claim 1, wherein said coherent laser energy source emits coherent energy of approximately 1.3 $\mu$m.

8. The apparatus of claim 1, wherein said coherent laser energy source emits coherent energy of approximately 1.55 $\mu$m.

9. The apparatus of claim 1 wherein said semiconductor device includes films of selected materials and further comprising circuitry for extracting a film thickness value of said materials based on measurements of said semiconductor wafer surface roughness.

10. The apparatus of claim 9, wherein said films of selected materials comprise polycrystalline materials.

11. The apparatus of claim 10, wherein said films of selected materials comprise polycrystalline metals.

12. The apparatus of claim 1, further comprising:
means for measuring coherent transmitted electromagnetic beam energy;
means for measuring scattered transmitted electromagnetic beam energy; and
circuitry for extracting semiconductor wafer spectral emissivity based on measurements of said incident beam energy, measurements of said coherent reflected beam energy, measurements of said scattered beam energy, measurements of said coherent transmitted beam energy, and measurements of said scattered transmitted beam energy.

13. The apparatus of claim 1 wherein said fiber optic network further operates to receive electromagnetic beam energy leaving said semiconductor wafer.

14. The apparatus of claim 1 wherein said fiber optic network directs said coherent electromagnetic beam energy in a direction substantially perpendicular to said semiconductor wafer.

15. A method for measuring physical parameters of a semiconductor wafer using a coherent electromagnetic energy sensing process control device, comprising the steps of:

generating coherent electromagnetic energy;

transmitting said coherent electromagnetic energy along a fiber optic path;

directing said coherent electromagnetic energy as an electromagnetic beam in a direction substantially perpendicular to the semiconductor wafer;

measuring the amount of electromagnetic beam energy coherently reflected from the semiconductor wafer in said substantially perpendicular direction and simultaneously measuring the amount of electromagnetic beam energy scatter reflected from the semiconductor wafer surface; and determining semiconductor wafer surface roughness based on measurements of said coherent beam of electromagnetic energy, said coherently reflected electromagnetic beam energy, and said scatter reflected electromagnetic beam energy.

16. The method of claim 15, further comprising the steps of:

measuring the amount of electromagnetic beam energy coherently transmitted through the semiconductor wafer in said perpendicular direction and measuring the amount of electromagnetic beam energy scatter transmitted through the semiconductor wafer; and using said coherently transmitted energy measurements and said scatter transmitted energy measurements in determining semiconductor wafer surface roughness.

17. The method of claim 16 wherein said laser energy source wavelength ranges between 0.4-15 μm.

18. The method of claim 16 wherein said laser energy source wavelength range is approximately 1.3 μm.

19. The method of claim 16 wherein said laser energy source wavelength range is approximately 1.55 μm.

20. The method of claim 16, further comprising the step of calculating semiconductor wafer spectral emissivity based on measurements of said coherently reflected electromagnetic beam energy, said scatter reflected electromagnetic beam energy, coherently transmitted electromagnetic beam energy, and scatter transmitted electromagnetic beam energy.

21. The method of claim 15, further comprising the step of operating said coherent electromagnetic energy sensing process control device in a semiconductor wafer processing reactor.

22. The apparatus of claim 15, wherein said coherent beam of electromagnetic energy comprises a laser energy source.

23. The method of claim 15, further comprising the steps of:

receiving said coherently reflected electromagnetic beam energy using a coherent reflection sensor; and receiving said scatter reflected electromagnetic beam energy using a scatter reflection sensor, said scatter reflection sensor including an imaging lens for focusing said scatter reflected electromagnetic energy to said scatter reflection sensor.

24. The apparatus of claim 23, wherein said coherent reflection sensor includes an imaging lens for focusing said coherently reflected electromagnetic beam energy to said coherently reflection sensor.

25. The method of claim 15, further comprising the steps of:

receiving coherently reflected electromagnetic beam energy using a coherent transmission sensor; and receiving scatter transmitted electromagnetic beam energy using a scatter transmission sensor, said scatter transmission sensor including an imaging lens for focusing said scatter transmitted electromagnetic energy to said scatter reflection sensor.

26. The apparatus of claim 25, wherein said coherent transmission sensor includes an imaging lens for focusing said coherently transmitted electromagnetic energy to said coherent transmission sensor.

27. The method of claim 15, further comprising the step of extracting film thickness based on measurements of said semiconductor wafer surface roughness.

28. The apparatus of claim 27, wherein said film comprises a polycrystalline film.

29. The method of claim 15 and further including the step of transmitting electromagnetic energy leaving said semiconductor wafer surface along a fiber optic path prior to said measuring steps.

30. A system for semiconductor wafer processing comprising:

a semiconductor wafer fabrication reactor; and an electromagnetic energy sensing fabrication process control device, comprising:

an energy source for producing coherent electromagnetic energy;

a fiber optic network for directing said coherent electromagnetic energy in the direction of a semiconductor wafer;

a first receive sensor element for measuring the amount of electromagnetic power coherently reflected from the semiconductor wafer surface in the specular direction;

a second receive sensor element for measuring the amount of electromagnetic power scatter reflected from the semiconductor wafer surface;

a transmit sensor element for measuring the amount of electromagnetic power coherently transmitted through the semiconductor wafer and the amount of electromagnetic power scatter transmitted through the semiconductor wafer; and components for determining semiconductor wafer surface roughness based on measurements of said coherently reflected electromagnetic power, said scatter reflected electromagnetic power, said coherently transmitted electromagnetic power, and said scatter transmitted electromagnetic power.

31. The semiconductor wafer fabrication system of claim 30, wherein said electromagnetic energy sensing process control device operates in a semiconductor wafer processing reactor.

32. The semiconductor wafer fabrication system of claim 30, wherein said source for producing a coherent electromagnetic energy source comprises a laser energy source.

33. The system of claim 30, wherein said electromagnetic energy sensing process control device further comprises a coherent reflection sensor for receiving said coherently reflected electromagnetic power and a scatter reflection sensor for detecting said scattered reflected electromagnetic power, said scatter reflection sensor comprising an electromagnetic energy detector and an imaging lens for focusing said scattered reflected electromagnetic power to said scattered reflected electromagnetic energy detector, and said coherent reflection sensor comprising an electromagnetic energy detector and an imaging lens for focusing said coherently reflected electromagnetic power to said coherent reflected electromagnetic energy detector.

34. The semiconductor wafer fabrication system of claim 30, wherein said electromagnetic energy sensing process control device further comprises circuitry for extracting polycrystalline metal film thickness based on measurements of said semiconductor wafer surface roughness.

35. The semiconductor wafer fabrication system of claim 30, wherein said electromagnetic energy sensing process control device further comprises circuitry for extracting other polycrystalline film thickness values based on measurements of said semiconductor wafer surface roughness.

36. The semiconductor wafer fabrication system of claim 30, wherein said electromagnetic energy sensing process control device further comprises circuitry for extracting semiconductor wafer spectral emissivity based on measurements of said coherently reflected electromagnetic power, said scatter reflected electromagnetic power, said coherently transmitted electromagnetic power, and said scatter transmitted electromagnetic power.

37. The semiconductor wafer fabrication system of claim 30, wherein said electromagnetic energy sensing process control device further comprises circuitry for extracting total spectral reflectivity for a metal film versus metal film thickness for semiconductor wafer fabrication process diagnostic analysis.

38. The system of claim 30, wherein said fiber optic network further operates to receive electromagnetic energy leaving said semiconductor wafer surface.

39. The system of claim 30 wherein said fiber optic network directs said coherent electromagnetic beam energy in a direction substantially perpendicular to said semiconductor wafer.

40. A system for measuring semiconductor wafer temperature and adjusting the temperature measurements in a thermal processing reactor utilizing a heating lamp module, wherein the temperature measurement adjustments compensate for semiconductor wafer surface roughness and emissivity, comprising:
 a temperature measurement device, comprising:
  at least one pyrometer position with the heating lamp module between said pyrometer and the wafer;
  a light pipe optically coupling said pyrometer and the wafer through the lamp module, such that said pyrometer may determine the temperature of the wafer;
  a lamp power supply;
  a controller for adjusting output from the lamp module based on input from said pyrometer, such that the wafer temperature may be adjusted; and
  a device for measuring the semiconductor wafer surface roughness and spectral emissivity, said device comprising:
  a coherent electromagnetic energy source;
  components for directing coherent electromagnetic energy in the direction of the wafer;
  components for measuring the amount of electromagnetic power coherently reflected from the semiconductor wafer surface in the specular direction;
  components for measuring the amount of electromagnetic power scatter reflected from the semiconductor wafer surface;
  components for measuring the amount of electromagnetic power coherently transmitted through the semiconductor wafer in the specular direction;
  components for measuring the amount of electromagnetic power scatter transmitted through the semiconductor wafer;
  circuitry for extracting wafer surface roughness and spectral emissivity based on measurements of said . coherent electromagnetic energy, said coherently reflected electromagnetic power, said scattered reflected electromagnetic power, said coherently transmitted electromagnetic power, and said scatter transmitted electromagnetic power; and
  circuitry for compensating temperature measurements of said temperature measurement device for surface roughness and spectral emissivity measurements from said semiconductor wafer surface roughness and spectral emissivity device.

41. The semiconductor wafer temperature sensor and adjusting system of claim 40, wherein said semiconductor wafer surface roughness and spectral emissivity device operates within a semiconductor wafer processing reactor.

42. The semiconductor wafer temperature sensor and adjusting system of claim 40, further comprising a coherent reflection sensor for receiving said coherently reflected electromagnetic power and a scatter reflection sensor for detecting said scatter reflected electromagnetic power, said scatter reflection sensor comprising an imaging lens for focusing said scatter reflected electromagnetic power to said scatter reflection sensor, and said coherent reflection sensor comprising an imaging lens for focusing said coherently reflected electromagnetic power to said coherent reflection sensor.

43. The semiconductor wafer temperature sensor and adjusting system of claim 41, further comprising circuitry for extracting other polycrystalline film thickness values based on measurements of said semiconductor wafer surface roughness.

44. The semiconductor temperature determination and adjusting system of claim 40, wherein said coherent electromagnetic energy source comprises a laser energy source.

45. The semiconductor wafer temperature sensor and adjusting system of claim 40, further comprising a coherent reflection sensor for receiving said coherently reflected electromagnetic power and a scatter reflection sensor for detecting said scatter reflected electromagnetic power, said scatter reflection sensor comprising an imaging lens for focusing said scatter reflected electromagnetic power to said scatter reflection sensor and said coherent reflection sensor comprising an imaging lens for focusing said coherently reflected electromagnetic power to said coherent reflection sensor.

46. The semiconductor wafer temperature sensor and adjusting system of claim 40, further comprising circuitry for extracting polycrystalline metal film thickness based on measurements of said semiconductor wafer surface roughness.

47. The semiconductor wafer temperature sensor and adjusting system of claim 46, further comprising circuitry for extracting semiconductor wafer spectral emissivity based on measurements of said electromagnetic energy source, said coherently reflected electromagnetic power, said scatter reflected electromagnetic power, said coherently transmitted electromagnetic power, and said scatter transmitted electromagnetic power.

48. A sensor for semiconductor device manufacturing process control wherein said semiconductor device is on a stationary semiconductor wafer comprising:

an incident electromagnetic beam energy source;

a fiber optic network associated with said energy source for directing coherent electromagnetic beam energy in the direction of the semiconductor wafer;

a first receive sensor module for measuring electromagnetic beam energy reflected as coherent beam power from the semiconductor wafer in the specular direction and electromagnetic beam energy reflected as scattered beam power from the semiconductor wafer;

a second receive sensor module for measuring electromagnetic beam energy transmitted as coherent beam power through the semiconductor wafer in the specular direction and electromagnetic beam energy transmitted as scattered beam power through the semiconductor wafer;

circuitry for determining semiconductor wafer surface roughness based on the measurements of said beam energy reflected as coherent beam power and reflected as scattered beam power; and circuitry for extracting semiconductor wafer spectral emissivity based on measurements of said incident beam energy, measurements of coherent reflected beam energy, measurements of scattered reflected beam energy, measurements of coherent transmitted beam energy, and measurements of scattered transmitted beam energy.

* * * * *